US008305799B2

(12) United States Patent
Tsukada

(10) Patent No.: US 8,305,799 B2
(45) Date of Patent: Nov. 6, 2012

(54) SUPPLY VOLTAGE GENERATING CIRCUIT AND SEMICONDUCTOR DEVICE HAVING SAME

(75) Inventor: Shuichi Tsukada, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 230 days.

(21) Appl. No.: 12/793,199

(22) Filed: Jun. 3, 2010

(65) Prior Publication Data
US 2010/0309716 A1 Dec. 9, 2010

(30) Foreign Application Priority Data

Jun. 4, 2009 (JP) ................. 2009-135209

(51) Int. Cl.
*G11C 11/00* (2006.01)

(52) U.S. Cl. .................. 365/163; 365/189.07

(58) Field of Classification Search .......... 365/46, 365/94, 100, 113, 129, 148, 163, 185.13–185.33, 365/189.07–189.12, 206, 222, 226, 230.03–230.06; 257/2–5, 9, 296, 310, E21.35, E31.047, E27.006; 438/29, 95, 96, 166, 135, 240, 259, 365; 438/482, 486, 597, 785; 977/754
See application file for complete search history.

(56) References Cited

U.S. PATENT DOCUMENTS

| 5,699,303 | A | * | 12/1997 | Hamamoto et al. | ..... 365/189.09 |
| 5,841,705 | A | * | 11/1998 | Hamamoto et al. | ..... 365/189.09 |
| 5,995,435 | A | * | 11/1999 | Hamamoto et al. | .......... 365/226 |
| 7,639,540 | B2 | * | 12/2009 | Kim et al. | ............. 365/185.18 |
| 2007/0064473 | A1 | | 3/2007 | Lee et al. | |
| 2007/0091655 | A1 | | 4/2007 | Oyama et al. | |
| 2008/0137401 | A1 | | 6/2008 | Philipp et al. | |
| 2008/0180163 | A1 | * | 7/2008 | Matano | .......... 327/536 |
| 2008/0198657 | A1 | * | 8/2008 | Kim et al. | ............. 365/185.18 |

FOREIGN PATENT DOCUMENTS

| JP | 2007-074797 A | 3/2007 |
| JP | 2007-087568 A | 4/2007 |
| JP | 2008-165964 A | 7/2008 |

* cited by examiner

*Primary Examiner* — Alexander Sofocleous
*Assistant Examiner* — Harry W Byrne
(74) *Attorney, Agent, or Firm* — Sughrue Mion, PLLC

(57) ABSTRACT

A supply voltage generating circuit includes a first charge pump circuit that generates a first internal supply voltage, and second charge pump circuit that generates a second internal supply voltage. The absolute value of the second internal supply voltage is greater than that of the first internal supply voltage. The output terminal of the first charge pump circuit is connected to a secondary-side charging terminal of the second charge pump circuit. The secondary-side is an output-side of the corresponding charge pump circuit, and the charging terminal is an auxiliary charging terminal that supplies an auxiliary charge to a secondary-side output terminal of the corresponding charge pump circuit. The output terminal of the second charge pump circuit outputs a voltage value that is the result of adding a prescribed voltage value to the value of the first internal supply voltage applied to the charging terminal.

8 Claims, 16 Drawing Sheets

SUPPLY VOLTAGE GENERATING CIRCUIT AND SEMICONDUCTOR DEVICE HAVING SAME

REFERENCE TO RELATED APPLICATION

This application is based upon and claims the benefit of the priority of Japanese patent application No. 2009-135209, filed on Jun. 4, 2009, the disclosure of which is incorporated herein in its entirety by reference thereto.

TECHNICAL FIELD

This invention relates to an internal supply voltage generating circuit and to a semiconductor device having this internal supply voltage generating circuit. More particularly, the invention relates to a semiconductor device having an internal supply voltage generating circuit that generates a plurality of supply voltages and load circuits that use the plurality of internal supply voltages. The invention further relates to a semiconductor device and non-volatile semiconductor storage device having a plurality of internal supply voltage generating circuits necessary to pass current into storage elements in order to set information in the storage elements, and a circuit for transmitting outputs of the plurality of internal supply voltages to the storage elements.

BACKGROUND

In semiconductor devices, there are occasions where it is necessary to generate an internal supply voltage higher than a voltage externally supplied from an external power supply. For example, a phase-change memory, which is a non-volatile semiconductor storage device and one type of variable-resistance memory cell through which a current is passed to store information, requires a high voltage and much current to write data. For this reason, the semiconductor device is provided internally with a charge pump circuit, the externally provided supply voltage is boosted and the boosted voltage is used in a write circuit. In a phase-change memory, a set pulse or a reset pulse is applied to phase-change elements to thereby pass the corresponding currents, and each of the phase-change elements is set to an amorphous state or to a crystalline state by the temperature profile of the heat produced, whereby each phase-change element stores the corresponding data. Placing a phase-change element in the amorphous state rather than the crystalline state requires the passage of a larger current (a major portion of the current) in a shorter time. On the other hand, placing a phase-change element in the crystalline state rather than the amorphous state requires passing current over a longer period of time.

FIG. 6 of Patent Document 1 illustrates a charge pump circuit for supplying a write (program) pulse generator of a phase-change memory with power.

Patent Document 2 describes a phase-change memory using a normally operating auxiliary pump and a main pump, which operates only when the phase-change memory is programmed, thereby hastening start-up of the programming operation in comparison with the prior art in which charge pumping is started after programming commences.

Patent Document 3 does not relate to a phase-change device but describes a switching power supply device in which a plurality of charge pump circuits are serially connected, wherein the serially connected charge pump circuits are controlled synchronously in order to reduce ripple noise in the output voltage.

[Patent Documents 1]
Japanese Patent Kokai Publication No. JP-P2008-165964A, which corresponds to US 2008/137401A1.
[Patent Documents 2]
Japanese Patent Kokai Publication No. JP-P2007-087568A, which corresponds to US 2007/064473A1.
[Patent Documents 3]
Japanese Patent Kokai Publication No. JP-P2007-074797A, which corresponds to US 2007/091655A1.
[Patent Document 4]
US 2008/180163A1

SUMMARY

The entire disclosure of Patent documents 1-4 are incorporated herein by reference thereto.

The following analysis is given by the present invention: In Patent Documents 1 and 2 mentioned above, the power supply of a pulse generator for generating a reset pulse, which places a phase-change in to the amorphous state, and a set pulse, which places the element in the crystalline state, is the same power supply. The reset pulse requires the higher voltage. Accordingly, the set pulse, which requires a voltage lower than that of the reset pulse, is applied to the phase-change element upon stepping down the voltage that was boosted by a charge pump circuit in accordance with the reset pulse. As a consequence, power is consumed wastefully.

Further, even if the circuit is separated into a set-pulse supply generating circuit and a reset-pulse supply generating circuit and each boosts voltage, a problem will arise with regard to the external power supply that serves as the initial voltage that is input to each of the supply generating circuits. Specifically, there is some latitude or leeway with regard to upper and lower limits of the externally applied supply voltage allowable in terms of device specifications. When voltage is boosted by the charge pump circuit taking into consideration a case where the externally applied supplied voltage is at the lower limit, the boosted voltage will become too high and power consumed wastefully if the supply voltage rises to the upper limit.

The following analysis is further given by the present invention: The reset pulse necessitates a high boosted voltage. As a consequence, ripple noise increases in a case where multiple charge pump stages are serially connected, which is an arrangement in which the output on the secondary (output) side of the first charge pump stage is connected only to the primary (input) side of the second charge pump stage. This noise depends greatly upon the writing accuracy of a variable-resistance memory cell (a phase-change memory cell in this application) in which information is finalized by the temperature profile, which depends greatly upon the current value.

The following analysis is further given by the present invention: Currents that differ from one another are passed into a plurality of storage elements (N-number of storage elements) and the corresponding information is stored. To obtain the overall set current value (overall load current value) in order to store information "1" (a first state) in all N-number of the storage elements, the supply generating circuit for the set pulse must assure a supply capability greater than the overall set current value. Furthermore, to obtain the overall reset current value (overall load current value) in order to store information "0" (a second state) in all N-number of the storage elements, the supply generating circuit for the reset pulse must assure a supply capability greater than the overall reset current value. As a result, the circuit area of each power supply circuit becomes large in size. Thus there is much to be desired in the art.

According to a first aspect of the present invention there is provided a supply voltage generating circuit comprising a first charge pump circuit that generates a first internal supply voltage, and a second charge pump circuit that generates a second internal supply voltage having a voltage value larger than that of the first internal supply voltage in terms of absolute value. A secondary-side output terminal of the first charge pump circuit is connected to a charging terminal of the second charge pump circuit. The secondary-side is an output-side of the corresponding charge pump circuit, and the charging terminal is an auxiliary charging terminal that supplies an auxiliary charge to a secondary-side output terminal of the corresponding charge pump circuit. The secondary-side output terminal of the second charge pump circuit outputs a voltage value that is the result of adding a prescribed voltage value to the value of the first internal supply voltage applied to the charging terminal.

According to a second aspect of the present invention there is provided a semiconductor device comprising: a supply voltage generating circuit that includes a first charge pump circuit that generates a first internal supply voltage and a second charge pump circuit that generates a second internal supply voltage having a voltage value larger than that of the first internal supply voltage in terms of absolute value; and N-number (where N is an integer and $N \geq 2$ holds) of load circuits supplied with current from the supply voltage generating circuit. The supply voltage generating circuit is such that a secondary-side output terminal of the first charge pump circuit is connected to a charging terminal of the second charge pump circuit. The secondary-side is an output-side of the corresponding charge pump circuit, and the charging terminal is an auxiliary charging terminal that supplies an auxiliary charge to a secondary-side output terminal of the corresponding charge pump circuit. The secondary-side output terminal of the second charge pump circuit outputs a voltage value that is the result of adding a prescribed voltage value to the value of the first internal supply voltage applied to the charging terminal. One of the load circuits has any one state among first and second states, which indicate an operating state, and third state indicating a non-operating state. The first charge pump circuit supplies the first internal supply voltage from the output terminal of the first charge pump to a load circuit that is in the first state. The second charge pump supplies the second internal supply voltage from the output terminal of the second charge pump to a load circuit that is in the second state. When the total number of load circuits in the second state among the N-number of load circuits is Y (where Y is an integer and $Y \geq 1$ holds), the first charge pump supplies the second charge pump, via the charging terminal, with at least an amount of charge q2'×Y, which corresponds to the number Y of load circuits, necessary for the second state.

According to a third aspect of the present invention there is provided a semiconductor device comprising: a supply voltage generating circuit that includes: a first charge pump circuit that generates a first internal supply voltage and a second charge pump circuit that generates a second internal supply voltage having a voltage value larger than that of the first internal supply voltage in terms of absolute value; storage elements set to a first storage state by passing a first program current and set to a second storage state by passing a second program current having a current value the absolute value of which is greater than that of the first program current; and a program circuit that writes a maximum of N-number (where N is an integer and $N \geq 2$ holds) of any of the storage elements to the first storage state or the second storage state simultaneously. The supply voltage generating circuit is such that a secondary-side output terminal of the first charge pump circuit is connected to a charging terminal of the second charge pump circuit. The secondary-side is an output-side of the corresponding charge pump circuit, and the charging terminal is an auxiliary charging terminal that supplies an auxiliary charge to a secondary-side output terminal of the corresponding charge pump circuit. The secondary-side output terminal of the second charge pump circuit outputs a voltage value that is the result of adding a prescribed voltage value to the value of the first internal supply voltage applied to the charging terminal; and the program circuit supplies the storage elements with electric charge necessary for the first program current from the output terminal of the first charge pump circuit, and supplies the storage elements with electric charge necessary for the second program current from the output terminal of the second charge pump via the charging terminal.

The meritorious effects of the present invention are summarized as follows.

In accordance with the present invention, even if upper and lower limits of supply voltage externally supplied have some latitude, first and second supply voltages are boosted to the necessary voltages and are not boosted any higher. As a result, power is not consumed wastefully. Furthermore, since the second supply voltage is generated by using the first supply voltage at the charging terminal on the secondary side of the charge pump of the subsequent stage, the second supply voltage obtained is a stable voltage exhibiting reduced ripple. Other features and advantages of the present invention will be apparent from the following description taken in conjunction with the accompanying drawings, in which like reference characters designate the same or similar parts throughout the figures thereof.

PREFERRED MODES

Figure 1:
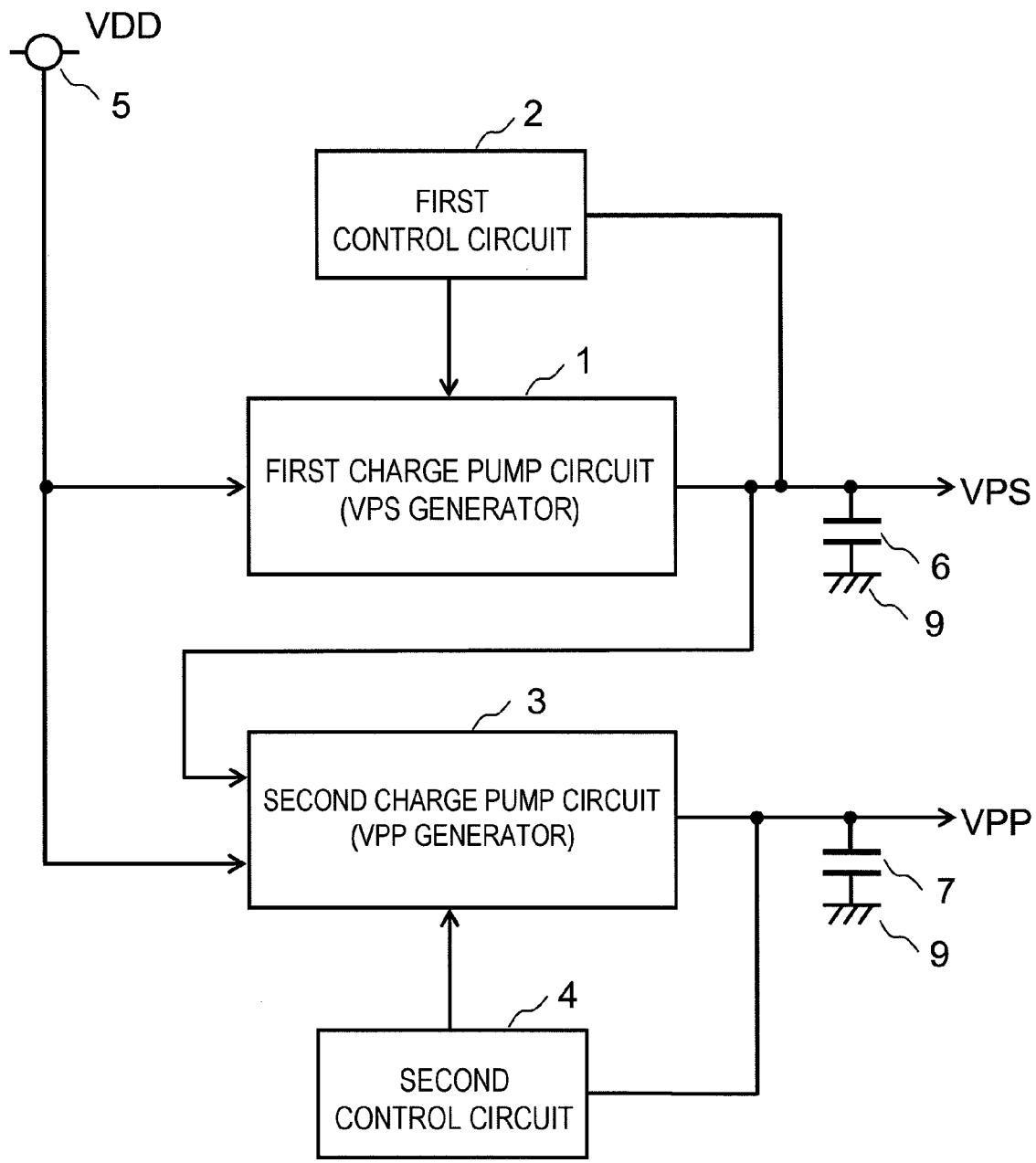
FIG. 1 is an overall block diagram of a supply voltage generating circuit according to an example of the present invention.

Representative examples of the technical idea for attaining the objects of the invention are illustrated below with reference to the drawings as necessary. It goes without saying that what is claimed in the application is not limited to this technical idea and is the content set forth in the claims of the application. It should be noted that the drawings and characters in the drawings cited in the description of the overview of the present invention illustrate one example of the present invention and do not limit the variations of the preferred modes according to the present invention.

One representative technical idea (a first technical idea) will be described. A supply voltage generating circuit according to the present invention applies the output voltage of a first charge pump circuit to a charging terminal (e.g., a charging terminal 51 in FIGS. 4 and 15) on the secondary side of a second charge pump circuit. Owing to such an arrangement, a boosted voltage (ΔV) at the secondary-side terminal is not directly acted upon by a fluctuation in supply voltage that is externally supplied. As a result, ripple noise at the output terminal of the second-stage charge pump circuit can be reduced. This effect is enhanced further by additionally providing the output terminal of the first-stage charge pump circuit with a smoothing capacitance element.

Another representative technical idea (a second technical idea) will be described. A supply voltage generating circuit or semiconductor device according to the present invention has N-number of load circuits supplied with current from a supply voltage generating circuit. These load circuits pass a first load current (i1') and a second load current (i2'), which have a pulsed current waveform, in conformity with the state (a first state or second state) of each load circuit. The second load current value is larger than the first load current value (i2'>i1') in the pulse current time period. On the other hand, a first consumption load value p1' (pulse current value×pulse time period), which indicates total charge amount (q1') consumed by a load circuit that is in the first state, is larger than a second consumption load value p2', which indicates total charge amount (q2') consumed by a load circuit that is in the second state (q1'>q2'=p1'>p2'). The reason for this is that in a case where a current is passed for a longer period of time in the first state than in the second state (a case where the pulse current time period in the first state is longer than the pulse current time period in the second state), there are instances where the following relationship holds: first consumption load value>second consumption load value. A first charge pump has a capability (first capability) equal to or greater than a total consumption load value P1=[(first consumption load per load circuit)×N number of load circuits] prevailing when all N-number of load circuits are in the first state. A second charge pump has a capability (second capability) equal to or greater than a total consumption load value P2=[(second consumption load per load circuit)×N number of load circuits] prevailing when all N-number of load circuits are in the second state. As a result, the capability (first capability) of the first charge pump is greater than the capability (second capability) of the second charge pump (P1>P2). One load circuit never passes the first load current and the second load current simultaneously. In other words, there are cases where, out of N-number (where N is an integer and N≧2 holds) of load circuits, X-number (where X is an integer and X≧0 holds) of load circuits indicate the first state and Y-number (where Y is an integer and X≧0 holds) of load circuits indicate the second state. Further, there are cases where at least one load circuit out of N-number of load circuits belongs to neither the first state nor the second state (i.e., this means that the load circuit does not pass any current). The first load current is supplied from an output terminal VPS of the first charge pump circuit. The second load current is supplied from an output terminal VPP of the second charge pump circuit, which generates a voltage whose absolute value is greater than that of the voltage that is output by the first charge pump circuit. As a result, according to the second technical idea, the value of at least a portion of the first capability possessed intrinsically by the first charge pump circuit can be made a portion or all of the second capability possessed intrinsically by the second charge pump circuit. This partial capability can be realized under at least several conditions. For example, when all load circuits indicate the second state (X=0, Y=N), the entirety of the first capability can be made a portion or all of the second capability. When some of all load circuits indicate the first state and the others indicate the second state (X≧1, Y≧1 and N=X+Y), a portion of the first capability can be made a portion or all of the second capability. This is decided by the ratio between X and Y (X:Y), the ratio between the first consumption load value and the second consumption load value (p1':p2'), and the relationship between both. When, in a case where only some of the load circuits out of all load circuits operate and some load circuits (◊) do not operate, all of the load circuits that do operate indicate the second state (X=0, Y=N−◊), a portion (p1'×◊) of the first capability, which corresponds to the number of load circuits that do not operate (the number of load circuits in a third state), can be made a portion or all of the second capability. More specifically, the first charge pump circuit has an assist function for assisting the second charge pump circuit. By virtue of these facts, the second charge pump can perform a boosting operation by using the first internal power supply voltage that has been boosted by the first charge pump circuit. As a result, a boosting capacitor in the second charge pump circuit can be reduced in size and the circuit area can be reduced.

Another semiconductor device according to the present invention has a program circuit for writing a first storage state (first state) or second storage state (second state) in parallel to any of a maximum N-number of storage elements (load circuits). By applying the first technical idea or the second technical idea or both the first and second technical ideas to this semiconductor device, ripple can be reduced and so can the circuit area of the second charge pump circuit.

Examples of the present invention will now be described in detail with reference to the drawings.

First Example

FIG. 1 is an overall block diagram of a supply voltage generating circuit 100 according to a first example. Although the circuit of FIG. 1 is a circuit particularly ideal as a supply voltage generating circuit for set program pulses and reset program pulses used in a phase-change memory, the application of the supply voltage generating circuit 100 is not limited to this example and can be used as a general-purpose supply voltage generating circuit. In FIG. 1, a first charge pump circuit (VPS generator) 1 is connected to an external power supply terminal VDD and generates a first supply voltage VPS from an external supply voltage VDD. The first charge pump circuit 1 is supplied by a first control circuit 2 with a clock for operating the charge pump and generates the first supply voltage VPS based upon this clock.

On the basis of the first supply voltage VPS, the first control circuit 2 controls the generation and cessation of the charge pump clock, which is applied to the first charge pump circuit 1, in such a manner that the first supply voltage VPS is held at a constant voltage. That is, if the first supply voltage VPS has been boosted to the necessary voltage, the first control circuit 2 halts the supply of the charge pump clock so that the first charge pump circuit 1 also halts the charge pumping operation. Further, a smoothing capacitor 6 is provided between the first supply voltage VPS and ground 9 so as to stabilize the first supply voltage VPS. It should be noted that although the smoothing capacitor 6 is provided between the first supply voltage VPS and ground 9, it will suffice if the smoothing capacitor with which the first supply voltage VPS is provided is connected to a stabilized potential, such as the external power supply terminal VDD, and thus the destination to which the smoothing capacitor is connected may be other than ground 9.

A second charge pump circuit (VPP generator) 3 is supplied with the first supply voltage VPS and with the voltage VDD from the external power supply terminal VDD and outputs a second supply voltage VPP. The second charge pump circuit 3 is supplied by a second control circuit 4 with a clock for operating the charge pump and generates the second supply voltage VPP based upon this clock.

On the basis of the second supply voltage VPP, the second control circuit 4 controls the generation and cessation of the charge pump clock, which is applied to the second charge pump circuit 3, in such a manner that the second supply voltage VPP is held at a constant voltage. That is, if the second supply voltage VPP has been boosted to the necessary voltage, the second control circuit 4 halts the supply of the charge pump clock so that the second control circuit 4 also halts the charge pumping operation. A smoothing capacitor 7 is connected to the second supply voltage VPP in a manner similar to that of the first supply voltage VPS.

Figure 2:
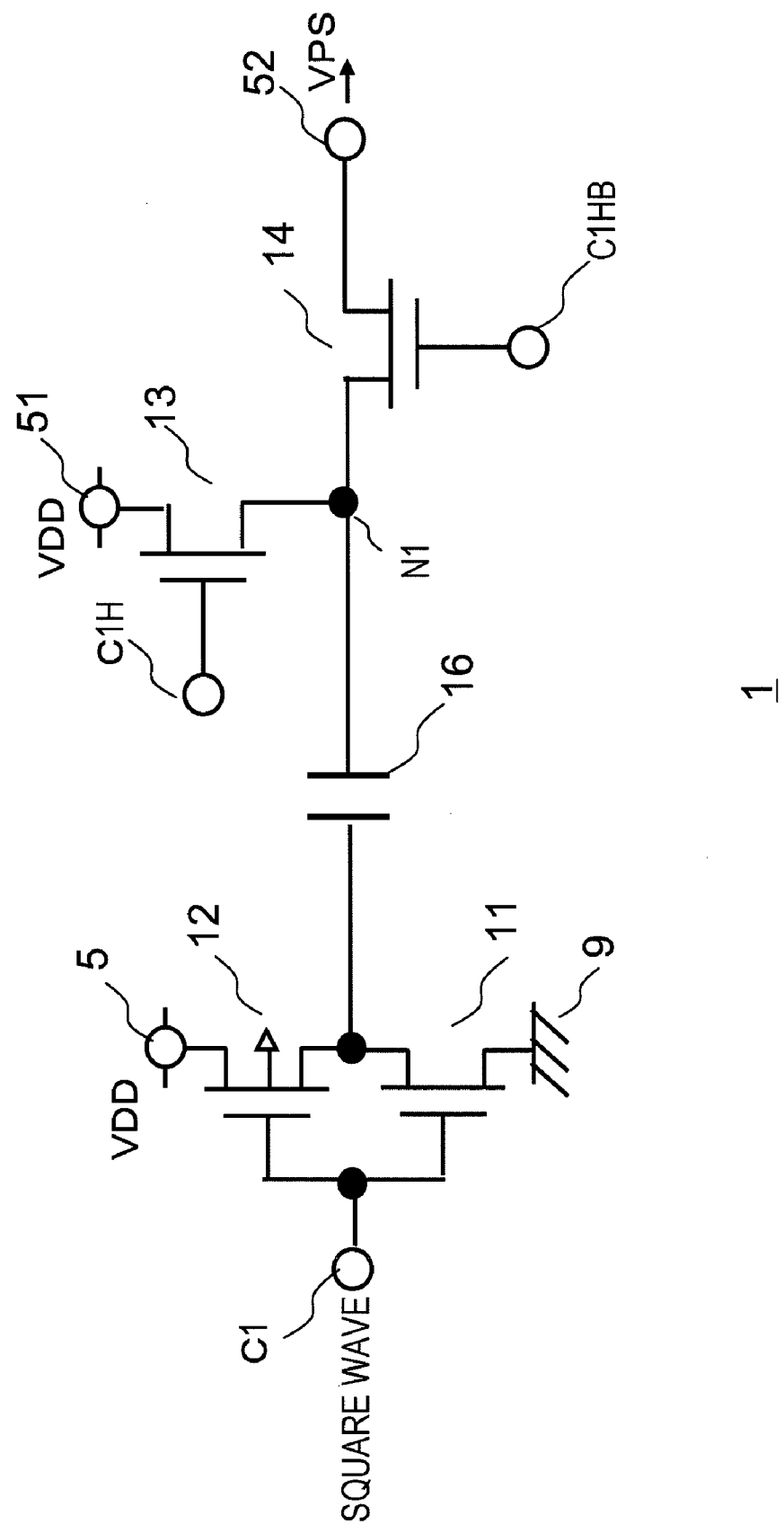
FIG. 2 is a block diagram illustrating a first charge pump circuit (VPS generator) in an example of the present invention.

FIG. 2 is a block diagram illustrating the first charge pump circuit (VPS generator) 1. As shown in FIG. 2, the clock signal from the first control circuit 2 is supplied to a clock input terminal C1. Further, clock input terminals C1H and C1HB are supplied from the first control circuit 2 with clock signals which are of the same and opposite phase, respectively, as that of the clock signal at clock input terminal C1 and which have been boosted to a high voltage. The first charge pump circuit 1 includes four switching transistors 11, 12, 13, 14 and a boosting capacitor 16. The switching transistor 11 is constituted by an NMOS transistor and has a source connected to ground 9, a drain connected to a first end of the capacitor 16 and a gate connected to the clock input terminal C1. The switching transistor 12 is constituted by a PMOS transistor and has a source connected to an external power supply terminal 5, a drain connected to the first end of the capacitor 16 and a gate connected to the clock input terminal C1. The switching transistors 11 and 12 constitute an arrangement similar to that of a CMOS inverter having the clock input terminal C1 as an input terminal, having an output terminal connected to the first end of the capacitor 16 and having the power supply connected to the VDD terminal, which is the external power supply terminal. The second end of the capacitor 16 is connected to the source and drain of the switching transistors 13, 14, respectively, which are NMOS transistors. The drain and source of the switching transistors 13, 14 are connected to a charging terminal 51 and to a voltage output terminal 52, respectively. The charging terminal 51 is connected to the external power supply terminal VDD, and the first supply voltage VPS is output from the voltage output terminal 52. Further, the gates of the switching transistors 13 and 14 are supplied with the clock signals which are of the same and opposite phase, respectively, as that of the clock signal at clock input terminal C1 and which have been boosted to a high voltage. When the clock signals are applied thereto, the first charge pump circuit 1 is capable of boosting the first supply voltage VPS, which is output from the voltage output terminal 52, to a level that is double the external power supply voltage VDD. In FIG. 2, the switching transistors 13 and 14 are both constituted by NMOS transistors. However, these can be constituted by PMOS transistors in which the back gate is connected to the first supply voltage VPS, by way of example. In such case the phase of the clock applied to the gate would be inverted. In other words, if the switching transistors 11, 12, 13, 14 are considered to be switches, then the first supply voltage VPS can be boosted to a voltage double that of the power supply VDD if a state in which switches 12 and 14 are rendered non-conductive by causing the switches 11 and 13 to conduct and a state in which switches 12 and 14 are made to conduct by rendering switches 11 and 13 non-conductive are alternated repeatedly.

Figure 3:
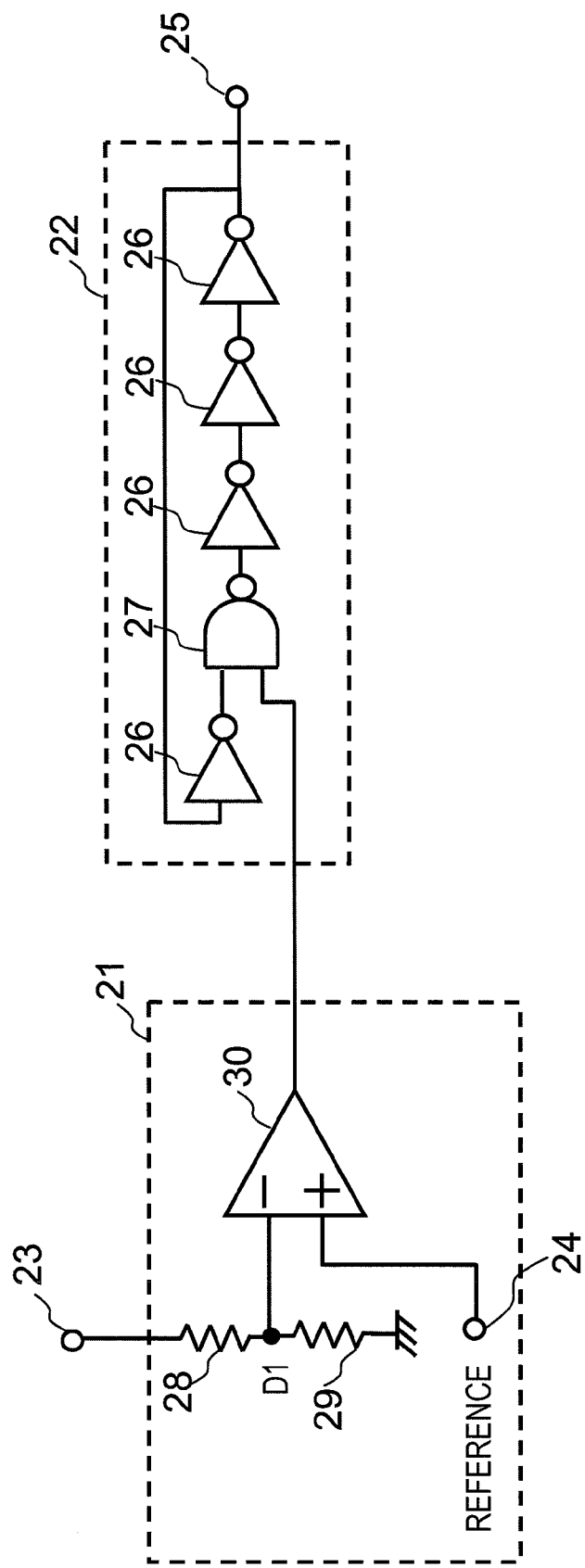
FIG. 3 is a block diagram of the main portion of control circuits in an example of the present invention.

FIG. 3 is a block diagram of the main portion of the first control circuit 2 and second control circuit 4 in this example. The control circuit of FIG. 3 includes a voltage comparator circuit 21 for discriminating the supply voltage connected to a supply voltage input terminal 23, and an oscillator circuit (ring oscillator circuit) 22 the oscillation and cessation of oscillation of which is controlled by the voltage comparator circuit 21. The voltage comparator circuit 21 comprises resistors 28, 29 for dividing the voltage at the supply voltage input terminal 23, and a comparator 30 for comparing the divided potential at a node D1 and the potential at a comparison-voltage input terminal 24. The comparator 30 outputs the high level if the potential at node D1 is lower than the voltage at comparison-voltage input terminal 24, and outputs the low level if the potential at node D1 is higher than the voltage at comparison-voltage input terminal 24. It should be noted that the comparison-voltage input terminal 24 may be connected to a reference voltage source provided within the semiconductor device.

The oscillator circuit (ring oscillator circuit) 22 is constituted by an odd number of cascade-connected inverting circuits, and the final stage of the inverting circuits is connected to the input of the first stage. More specifically, the oscillator circuit (ring oscillator circuit) 22 is constituted by an even number of inverters 26 and a NAND gate 27 the input to which is the output signal of the comparator 30. By virtue of this arrangement, the oscillator circuit 22 oscillates when the comparator 30 outputs the high level and ceases oscillating when the comparator 30 outputs the low level. The clock signal generated by the oscillator circuit 22 is output externally from a clock output terminal 25. Thus, the circuit functions as a control circuit for comparing the voltage at node D1, at which the voltage at the supply voltage input terminal is divided by the resistors 28, 29, with the voltage at the comparison-voltage input terminal 24, outputting the clock from the clock output terminal 25 when the voltage at the supply voltage input terminal 23 is less than the reference voltage (a voltage decided by the resistors 28, 29 and the voltage at the comparison-voltage input terminal 24), and halting the output of the clock signal when the voltage at the supply voltage input terminal 23 exceeds the reference voltage.

It should be noted that the supply voltage input terminal 23 is connected to the first supply voltage VPS in the case of the first control circuit 2 and is connected to the second supply voltage VPP in the case of the second control circuit 4. Further, the clock output terminal 25 is connected to the first charge pump circuit 1 in the case of the first control circuit 2 and is connected to the second charge pump circuit 3 in the case of the second control circuit 4.

Figure 4:
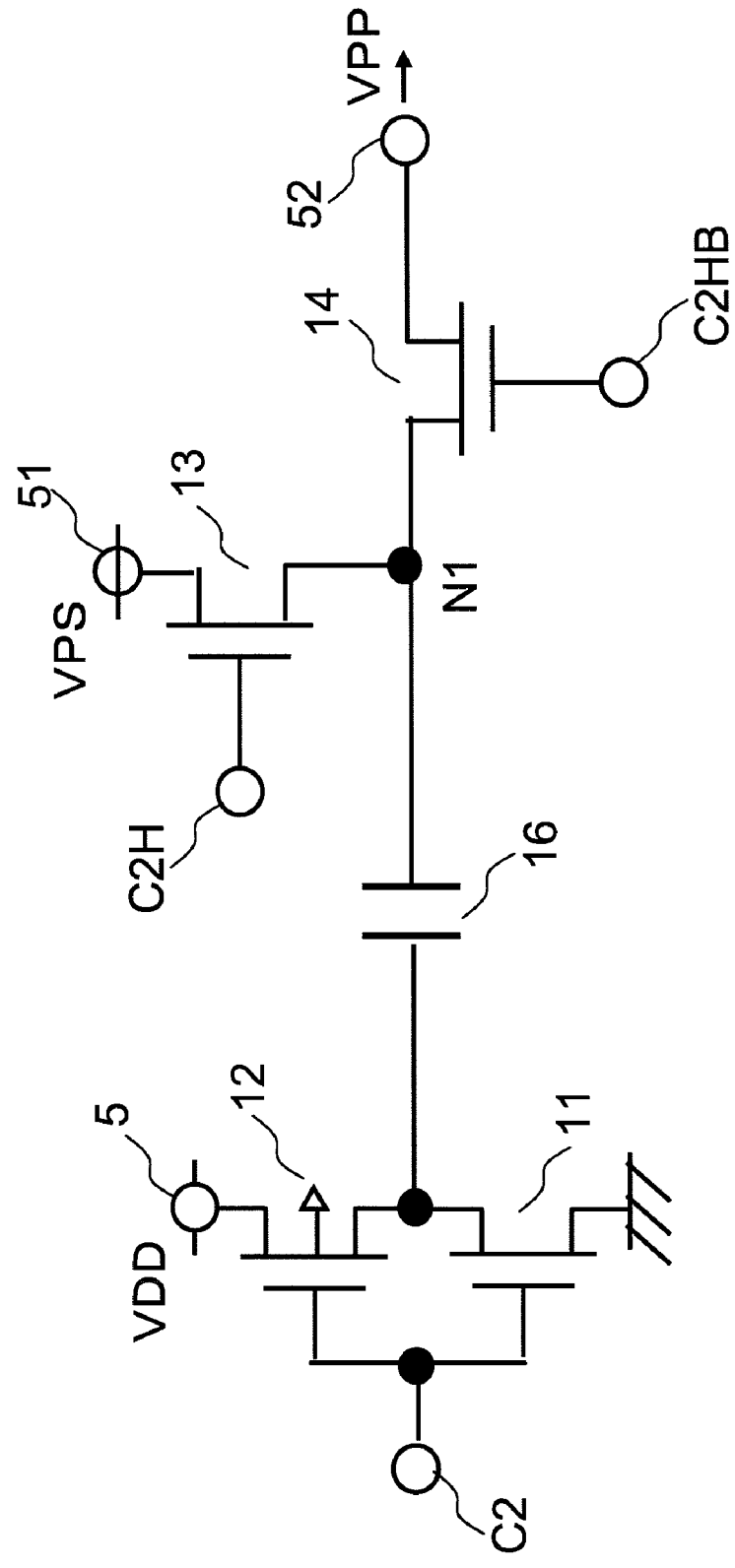
FIG. 4 is a block diagram illustrating a second charge pump circuit (VPP generator) in an example of the present invention.

FIG. 4 is a block diagram illustrating the second charge pump circuit (VPP generator) 3. The basic structure of the second charge pump circuit 3 is the same as that of the first charge pump circuit 1 shown in FIG. 2. However, whereas the charging terminal 51 is connected to the external power supply terminal VDD in the case of the first charge pump circuit 1, it is connected to the voltage output terminal 52 of the first charge pump circuit 1 and supplies the first supply voltage VPS. Owing to the fact that the charging terminal 51 is connected not to the external power supply VDD but to the first supply voltage VPS that is output by the first charge pump circuit 1, the second charge pump circuit 3 can output a voltage from the voltage output terminal 52 that is higher than the voltage from the first charge pump circuit 1. Further, since the first supply voltage VPS supplied from the charging terminal 51 is controlled by the first control circuit 2 so as to be a constant voltage, ripple in the second supply voltage VPP that is output from the voltage output terminal 52 can be reduced and a more stable voltage is obtained. The reason for this will be given later.

Figure 5:
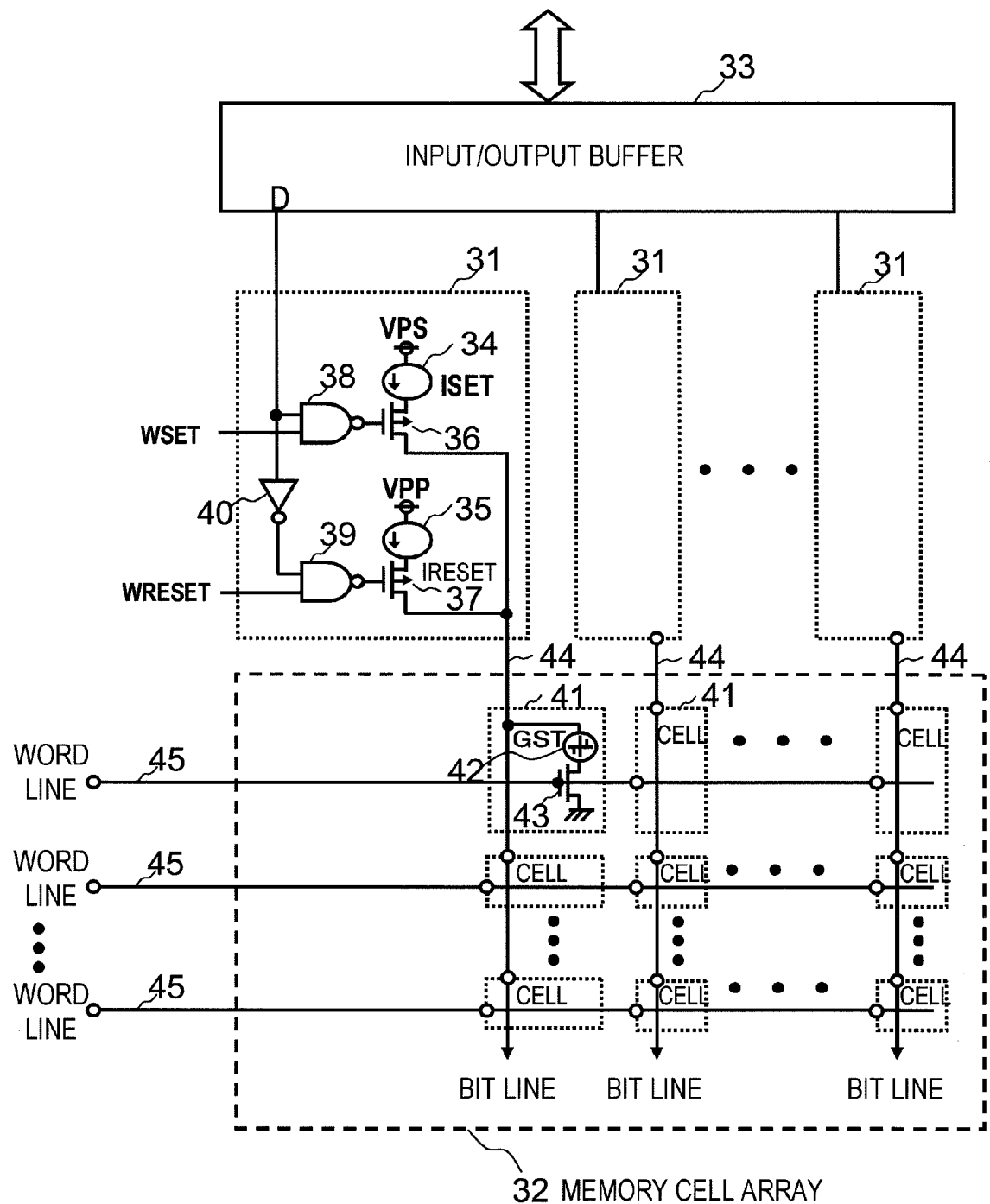
FIG. 5 is a block diagram of a phase-change memory.

FIG. 5 is a block diagram of a phase-change memory that employs the supply voltage generating circuit 100 of the first example. The phase-change memory of FIG. 5 has the usual configuration of a phase-change memory except for the fact that the first supply voltage VPS and second supply voltage VPP produced by the supply voltage generating circuit 100 are used as the power supplies. FIG. 5 illustrates only the circuitry related to an operation for programming the phase-change memory to data that is written externally; circuitry such as that for sensing data from memory cells is not shown. In FIG. 5, an input/output buffer 33 receives externally input write data and externally outputs data read from memory cells.

A memory cell array 32 includes a plurality of bit lines 44, a plurality of word lines 45 wired in a direction intersecting the bit lines 44, and a plurality of memory cells 41 provided in correspondence with respect ones of intersections between the plurality of bit lines 44 and plurality of word lines 45. Each memory cell 41 includes a phase-change element (GST) 42 and a cell transistor 43. The cell transistor 43 has a gate connected to the corresponding word line 45, a source connected to ground and a drain connected to a first end of the phase-change element 42. The second end of the phase-change element 42 is connected to the corresponding bit line 44. The phase-change element 42 consists of, e.g., GST (Ga—Sb—Te: Germanium-Antimony-Tellurium). The phase-change element 42 can be set to the amorphous state or crystalline state by the temperature profile of heat produced by the current that flows through the phase-change element 42 at programming time. The resistance value of the phase-change element 42 is smaller when the element is in the crystalline state than when it is in the amorphous state. Accordingly, the phase-change element 42 of the memory cell 41 is placed in the amorphous state or crystalline state based upon the data that will be stored in the memory cell 41, and when the data that has been stored in the memory cell 41 is read out, the data can be read out by sensing the resistance value of the phase-change element 42.

A program circuit 31 programs the corresponding memory cell 41 (selected by word line 45) to the amorphous state or crystalline state based upon write data that has been input from the input/output buffer 33. The program circuit 31 includes a set program circuit (NAND gate 38, setting current source circuit 34, set-current switching transistor 36) for setting the phase-change element 42 of the corresponding memory cell 41 to the crystalline state when the write data that has entered from the input/output buffer 33 is the high level, and a reset program (NAND gate 39, setting current source circuit 35, reset-current switching transistor 37) for resetting the phase-change element 42 of the corresponding memory cell 41 to the amorphous state when the write data is the low level. A plurality of the program circuits 31 are provided and are connected to respective ones of different bit lines. Accordingly, when one word line 45 is selected from among the plurality of word lines 45, data can be written simultaneously from the plurality of program circuits 31 to the memory cells 41 connected to the corresponding bit lines 44 and selected word line 45 (each of the memory cells 41 can be programmed from the reset state to the set state or from the set state to the reset state simultaneously). Whether each memory cell 41 is reset to the amorphous state or set to the crystalline state depends upon the write data. Accordingly, if a case where all memory cells written simultaneously are reset is conceivable, then a case where all memory cells are set is also conceivable. However, the maximum number of memory cells written simultaneously is decided in advance. Let N represent this number of memory cells. Further, in a case where a verify operation is included, the number of reset cells and the number of set cells written simultaneously vary. However, the maximum number N is never exceeded.

The set program circuit includes the NAND gate 38, which receives a write data signal D from the input/output buffer 33 and a set-program timing signal WSET as inputs, and whose output is connected to the set-current switching transistor 36; the setting current source circuit 34 for passing a previously decided set program current ISET from the first supply voltage VPS; and the set-current switching transistor 36 which, when the output of the NAND gate 38 is the low level, connects the current source circuit 34 to the corresponding bit line 44 and passes the set program current through the bit line 44.

The reset program circuit includes the NAND gate 39, which receives a signal (the output signal of an inverter 40) obtained by inverting the write data signal D from the input/output buffer 33 and a reset-program timing signal WRESET as inputs, and whose output is connected to the reset-current switching transistor 37; the setting current source circuit 35 for passing a previously decided reset program current IRESET from the second supply voltage VPP; and the reset-current switching transistor 37 which, when the output of the NAND gate 39 is the low level, connects the current source circuit 35 to the corresponding bit line 44 and passes the reset program current through the bit line 44.

Although the program circuit 31 is provided for every single bit line 44 in FIG. 5, a column selector circuit may be provided between a single program circuit 31, which is provided as a common program circuit for the plurality of bit lines, and the memory cell array 32, and the column selector circuit may select which bit line among the plurality thereof is selected so that the memory cell of this bit line is programmed.

Figure 6:
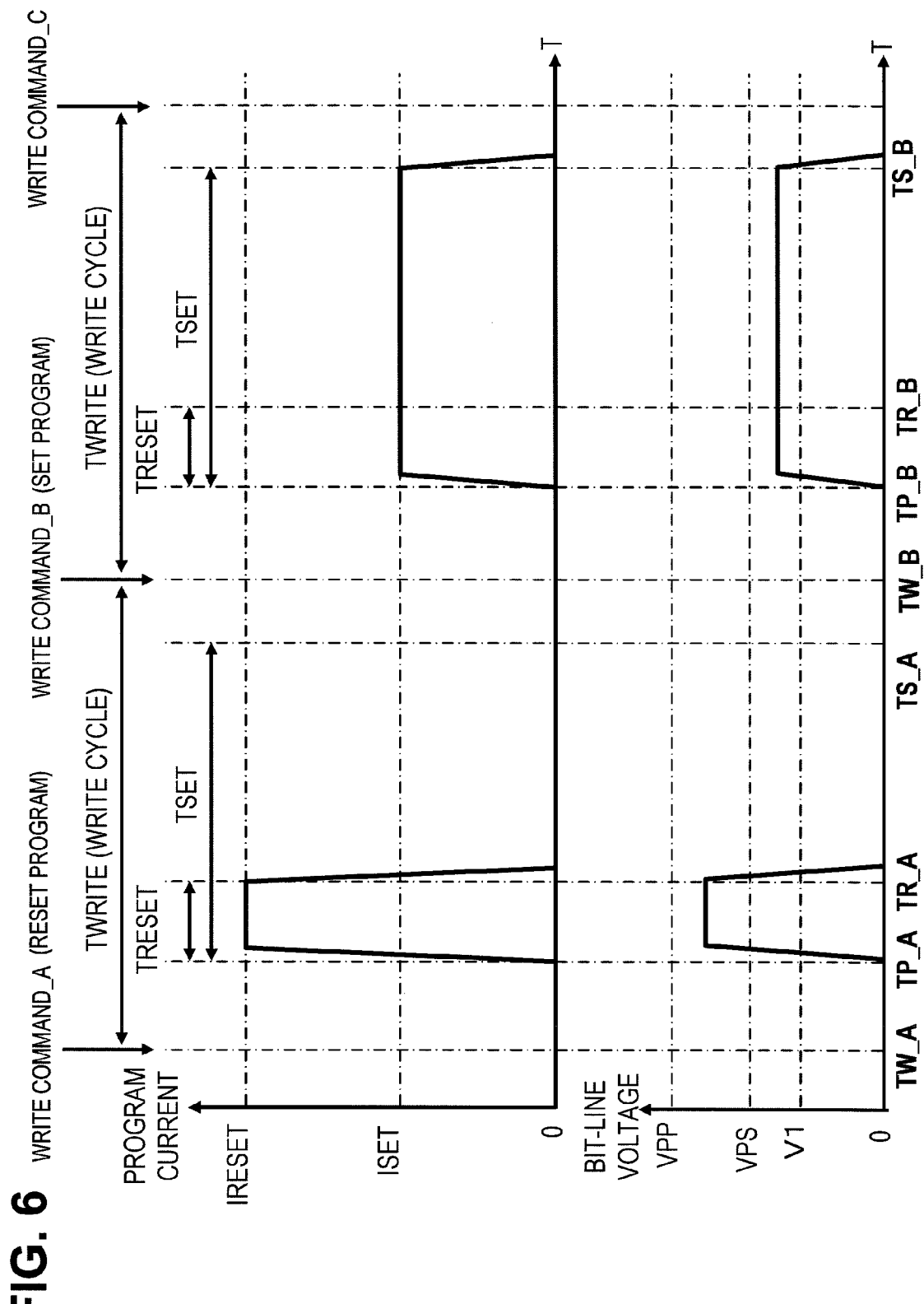
FIG. 6 is a waveform diagram of program pulses of a phase-change memory.

FIG. 6 is a waveform diagram illustrating voltage and current of program pulses in FIG. 5. In FIG. 6, execution of a write cycle (TWRITE) in response to a write command_A starts, and a reset program operation for memory-cell reset begins, at a timing TW_A. At a timing TP_A, the reset-program timing signal WRESET in FIG. 5 attains the high level, in response to which the reset-current switching transistor 37 conducts so that the reset program current IRESET flows from the program circuit 31 to ground via the corresponding bit line 44 and phase-change element 42 and cell transistor 43 of the corresponding memory cell 41. Owing to flow of the reset program current IRESET, the potential of the corresponding bit line 44 rises to a voltage greater than the first supply voltage VPS. When the next timing TR_A arrives, the reset-program timing signal WRESET falls to the low level and the reset-current switching transistor 37 changes from the conductive to the non-conductive state. When this occurs, the reset program current IRESET stops flowing. As a result, the bit-line voltage returns to 0 V. The time over which the reset program current IRESET flows is a time period TRESET, which is decided by the reset-program timing signal WRESET.

It should be noted that a case where all write data is reset every time in response to the write command that is input every TWRITE (write cycle) is possible. This is a condition where the combustion current of VPP is maximum. In this case, maximum combustion current of VPP is represented by the following equation:

$$\text{maximum combustion current of } VPP = IRESET \times N \times TRESET/TWRITE \quad \text{Equation (1)}$$

It is required that the VPP generator be set to a VPP current supply capability greater than the maximum combustion current of VPP.

Next, execution of a write cycle (TWRITE) in response to a write command_B starts, and a set program operation for memory-cell set begins, at a timing TW_B. At a timing TP_B, the set-program timing signal WSET in FIG. 5 attains the high level, in response to which the set-current switching transistor 36 conducts so that the set program current ISET flows from the program circuit 31 to ground via the corresponding bit line 44 and phase-change element 42 and cell transistor 43 of the corresponding memory cell 41. Owing to flow of the set program current ISET, the potential of the corresponding bit line 44 rises to a voltage greater than V1, which is the minimum value of voltage variation of the external power supply VDD. When the next timing TS_B arrives, the set-program timing signal WSET falls to the low level and the set-current switching transistor 36 changes from the conductive to the non-conductive state. When this occurs, the set program current ISET stops flowing. As a result, the bit-line voltage returns to 0 V. The time over which the reset program current ISET flows is a time period TSET, which is decided by the set-program timing signal WSET.

It should be noted that a case where all write data is set every time in response to the write command that is input every TWRITE is possible. This is a condition under which VPS combustion current is maximum. In this case, maximum combustion current of VPS is represented by the following equation:

$$\text{maximum combustion current of } VPS = ISET \times N \times TSET/TWRITE \quad \text{Equation (2)}$$

It is required that the VPS generator be set to a VPP current supply capability greater than the maximum combustion current of VPS.

As described above, the operation in which program current flows from the program circuit 31 to the memory cell 41 via the bit line 44 is basically the same at reset time and set time. However, the size of the program current and the length of the time period over which current flows at reset time differ from those at set time. The reset program current that places the phase-change element 42 of the memory cell 41 in the amorphous state is larger than the set program current that places the phase-change element 42 in the crystalline state. However, with regard to the time period over which the current flows, the time period over which the set program current flows is longer than that over which the reset program current flows. Owing to the difference in current size and the difference in time period over which current flows, the amount of memory-cell heat evolved when current flows differs. This means that the temperature profile applied to the phase-change element 42 of the memory cell 41 differs as well. The phase-change element 42 can be placed in the amorphous state or crystalline state owing to the difference in temperature profile.

In results obtained from experiments conducted by the inventors, the optimum value of IRESET is a current value that is approximately twice the value of ISET, and the optimum size of TSET is a time period that is three to six times the time period of TRESET. Accordingly, the maximum combustion current of VPS [Equation (2)] is 1.5 to 3 times the maximum combustion current of VPP [Equation (1)]. The VPS current supply capability, therefore, is se to 1.5 to 3 times the VPP current supply capability.

Assume that VPS=2×VDD, VPP=3×VDD holds. If one cycle of a square wave is input to a clock input terminal C2 of the VPP generator 3 of FIG. 4 according to the first example, then current will flow from the voltage output terminal 52 to VPP. If we let I1 represent the value of the current supplied to VPP, then the current value I1 will be consumed from VPS, which is connected to the charging terminal 51. The reason for this is that in the charge pump operation, electric charge in an amount identical with the electric charge that is output from the capacitor 16 to VPP during the time that the clock input terminal C2 is at the low level re-charges the capacitor 16 from VPS through the switching transistor 13 during the time that the clock input terminal C2 is at the high level.

Accordingly, if the VPS current supply capability is set so as to exceed the value of Equation (2) and, moreover, the value of Equation (2) is greater than the value of Equation (1) [the value of Equation (2) is usually 1.5 to 3 times greater], then the VPS current supply capability will not be inadequate even though the current from VPS is consumed by the VPP generator 3.

It should be noted that when the set program current ISET is passed into a bit line, the voltage of this bit line rises to a voltage greater than V1, which is the minimum value of the voltage range in terms of the specifications of the external power supply VDD, as illustrated in FIG. 6. Accordingly, it is required that the set program current ISET of the memory cell 41 be passed from the first supply voltage VPS the voltage of which is higher than the external supply voltage VDD. Similarly, when the reset program current IRESET is passed into a bit line, the voltage of this bit line rises to a voltage greater the first supply voltage VPS. Accordingly, it is required that the reset program current IRESET of the memory cell 41 be passed from the second supply voltage VPP the voltage of which is higher than the first supply voltage VPS. Furthermore, since the first supply voltage VPS is lower than the second supply voltage VPP and is only boosted to a voltage necessary to pass the set program current ISET, wasteful power consumption involved in lowering the boosted voltage after such boosting can be kept to the minimum. The reason for this is that with charge-pump-type boosting utilizing a capacitor, efficiency (the ratio of power consumption corresponding to the current passed into the primary side necessary to achieve boosting to power consumption corresponding to the current on the secondary side) is low (20 to 30%) in comparison with the efficiency (on the order of 80%) of a DC-DC converter, and lowering voltage that has been boosted is indicative of wasteful power consumption.

Figure 7:
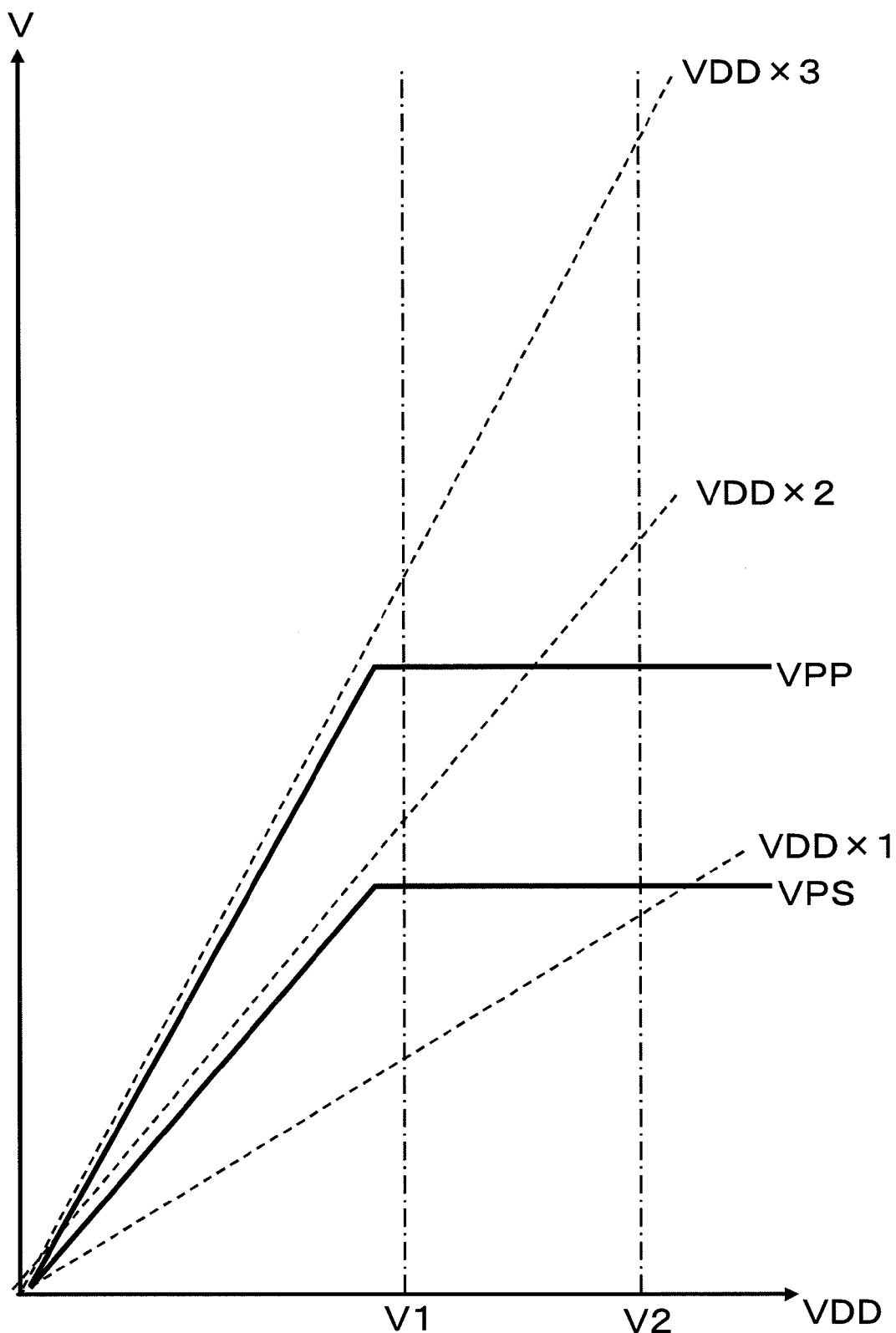
FIG. 7 is a diagram illustrating set voltages of a VPS power supply and a VPP power supply in an example of the present invention.

FIG. 7 is a diagram illustrating set voltages of the VPS power supply and VPP power supply in this example. The horizontal axis is a plot of voltage values of external power supply VDD. In terms of the specifications of a phase-change memory, assume that it is necessary to assure operation in a voltage range in which the external power supply VDD is greater than voltage V1 and less than voltage V2. The vertical axis indicates the upper-limit voltage to which boosting is possible in a case where the voltages are VDD, VPP, VPS and the charge pump circuit is one that is capable of boosting VDD to a voltage that is two and three times higher.

The voltage values of VPS, VPP are decided by the minimum voltages necessary to pass the currents ISET and IRESET, which are required to place a memory cell 41 in the crystalline state and amorphous state, respectively, upon taking into consideration a rise in voltage ascribable to the resistance of the memory cell 41 and bit line. It is required that the voltage levels of VPS, VPP be such that the voltage of the external power supply VDD be greater than V1 and less than V2. From this standpoint, it will be understood that boosting the first supply voltage VPS requires a charge pump circuit that boosts the external power supply voltage VDD by a factor of two, and that boosting the second supply voltage VPP requires a charge pump circuit that boosts the external power supply voltage VDD by a factor of three.

Figure 8:
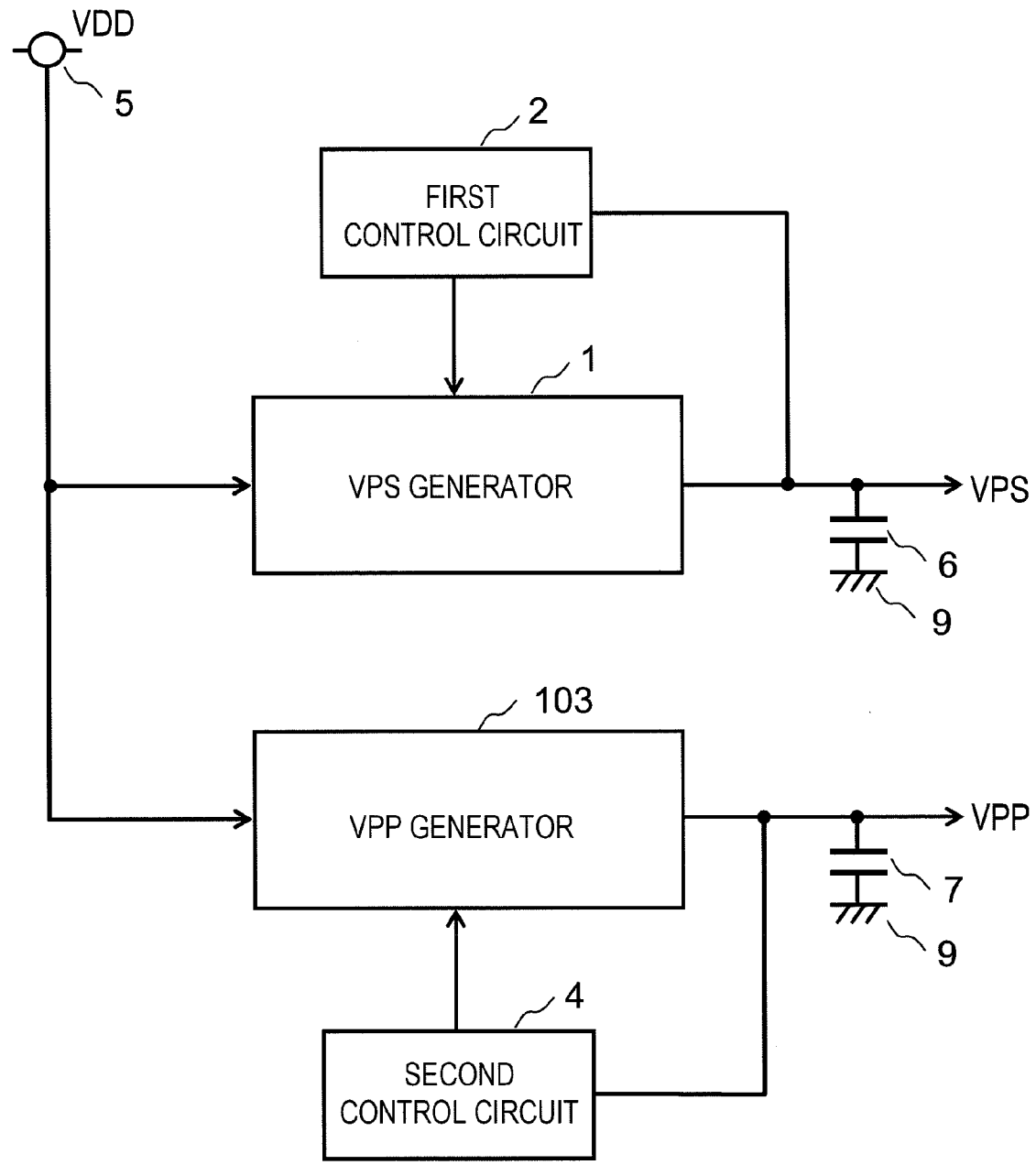
FIG. 8 is an overall block diagram of a supply voltage generating circuit according to a comparative example.

As a comparative example, consider a charge pump circuit in which the VPP generator 3 obtains a voltage, which has been raised by a factor of three, directly from the external power supply VDD without using the first supply voltage VPS, unlike the VPP generator 3 of the first example. FIG. 8 illustrates an overall block diagram of a supply voltage generating circuit according to the comparative example. If FIG. 8 is compared with FIG. 1, it will be understood that a VPP generator 103 in the comparative example is not supplied with voltage that has been boosted by the VPS generator 1 and is supplied only with the external power supply voltage VDD.

Figure 9:
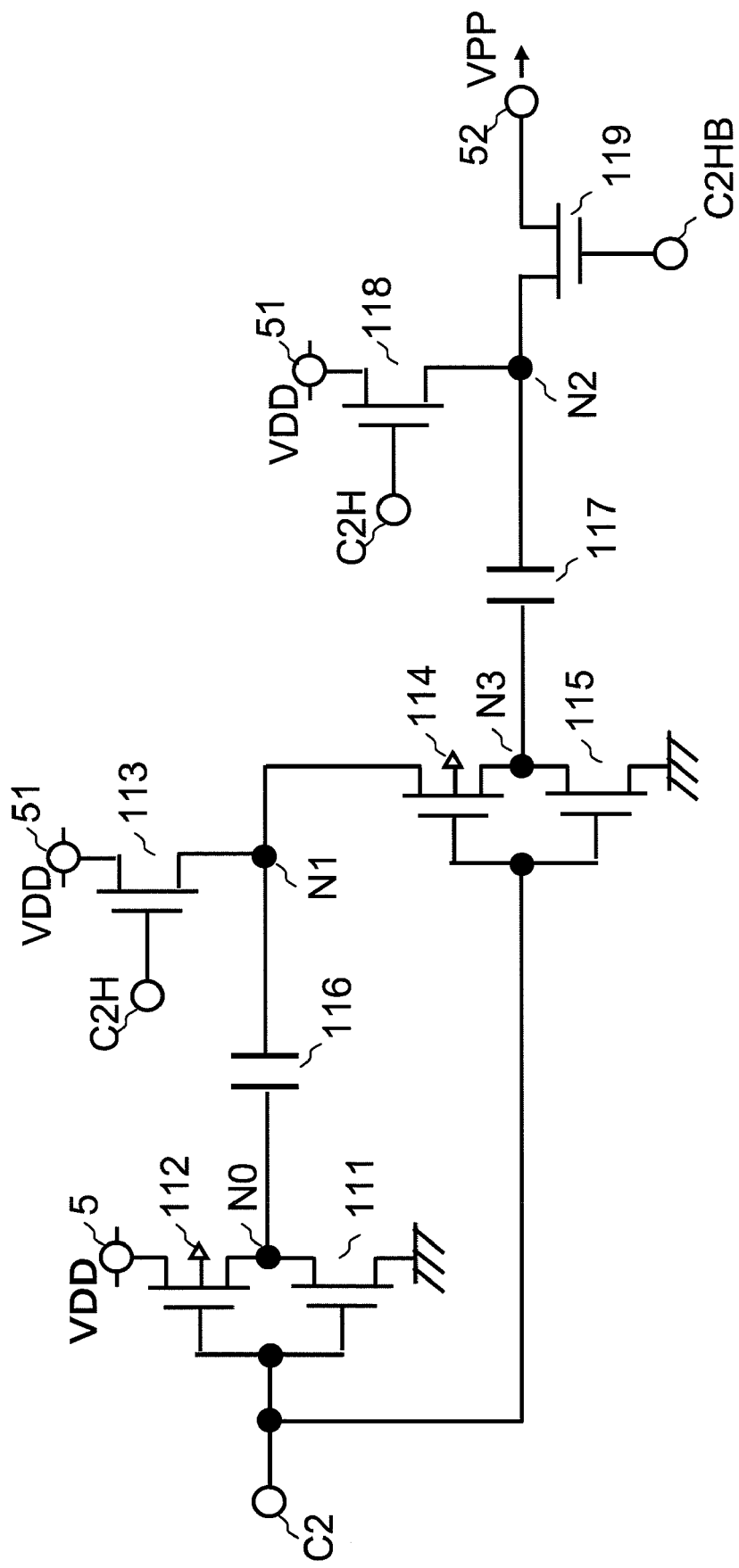
FIG. 9 is a block diagram illustrating a VPP generator (charge pump circuit) according to a comparative example.

FIG. 9 illustrates an example of the VPP generator 103, which obtains a trebled voltage from the external power supply voltage VDD. The VPP generator 103 of FIG. 9 is supplied with the external power supply voltage VDD as its power supply. The VDD-related clock signal supplied from the second control circuit 4 is applied to the terminal C2. A terminal C2H is supplied with a clock signal, which has been boosted to a voltage higher than VPP, in phase with the clock signal applied to the terminal C2. A terminal C2HB is supplied with a clock signal, which has been boosted to a voltage higher than VPP, the phase of which is opposite that of the clock signal applied to the terminal C2H. Owing to the clock signals supplied from the terminals C2, C2H and C2HB, switching transistors 111 to 115, 118 and 119 are switched and a charge pump operation is performed by boosting capacitors 116, 119, whereby the terminal VPP outputs a voltage that has been boosted to a voltage that is a maximum of three times the external power supply voltage. The switching transistors 112 and 114 are PMOS transistors, and the other switching transistors 111, 113, 115, 118, 119 are NMOS transistors.

The operation of the charge pump circuit of FIG. 9 will be described next. In order to simplify the description, it is assumed that there is no feed-through current and load capacitance for the switching transistors, and capacitors are considered to be only capacitors 116 and 117. When the clock terminals C2, C2H are at the high level and the clock terminal C2HB is at the low level, the switching transistors 111, 113, 115, 118 conduct and the other switching transistors 112, 114, 119 do not. At this time the voltages at nodes N0, N1, N3, N2 are ground, VDD, ground and VDD, respectively.

Next, when clock terminals C2, C2H are at the low level and clock terminal C2HB is at the high level, the switching transistors 112, 114, 119 conduct and the other switching transistors 111, 113, 115, 118 do not. At this time the voltage at node N0 changes from ground to VDD and therefore the voltage at node N1 also is raised from VDD to a voltage that is twice VDD by the capacitor 116. Further, since the switching transistor 114 conducts, the voltage at node N3 is raised from ground to a voltage that is twice VDD. When the voltage at node N3 rises to the voltage that is twice VDD, the voltage at node N2 rises from VDD to a voltage that is three times VDD and the VPP potential rises to a voltage that is a maximum of three times VDD via the switching transistor 119. Thus, the VPP generator 103 is capable of supplying a voltage that has been boosted to a voltage that is a maximum of three times the external power supply voltage VDD. That is, the VPP generator 103 functions as a charge pump circuit. Specifically, when the clock terminal C2 is at the high level, the VPP generator 103 charges the capacitors 116, 117 in parallel. When the clock terminal C2 is at the low level, the VPP generator 103 re-connects the charged capacitors 116, 117 serially with the node potential VDD on the input side of the capacitor 116 serving as a reference, thereby obtaining a voltage that is three times the external power supply voltage VDD and outputting this voltage from VPP. The VPP generator 103 repeats the charging and discharging of the capacitors 116, 117 in synch with the clock signals applied from the clock terminals C2, C2H, C2HB and supplies the second supply voltage VPP with a voltage that is three times the external power supply voltage VDD.

Figure 10:
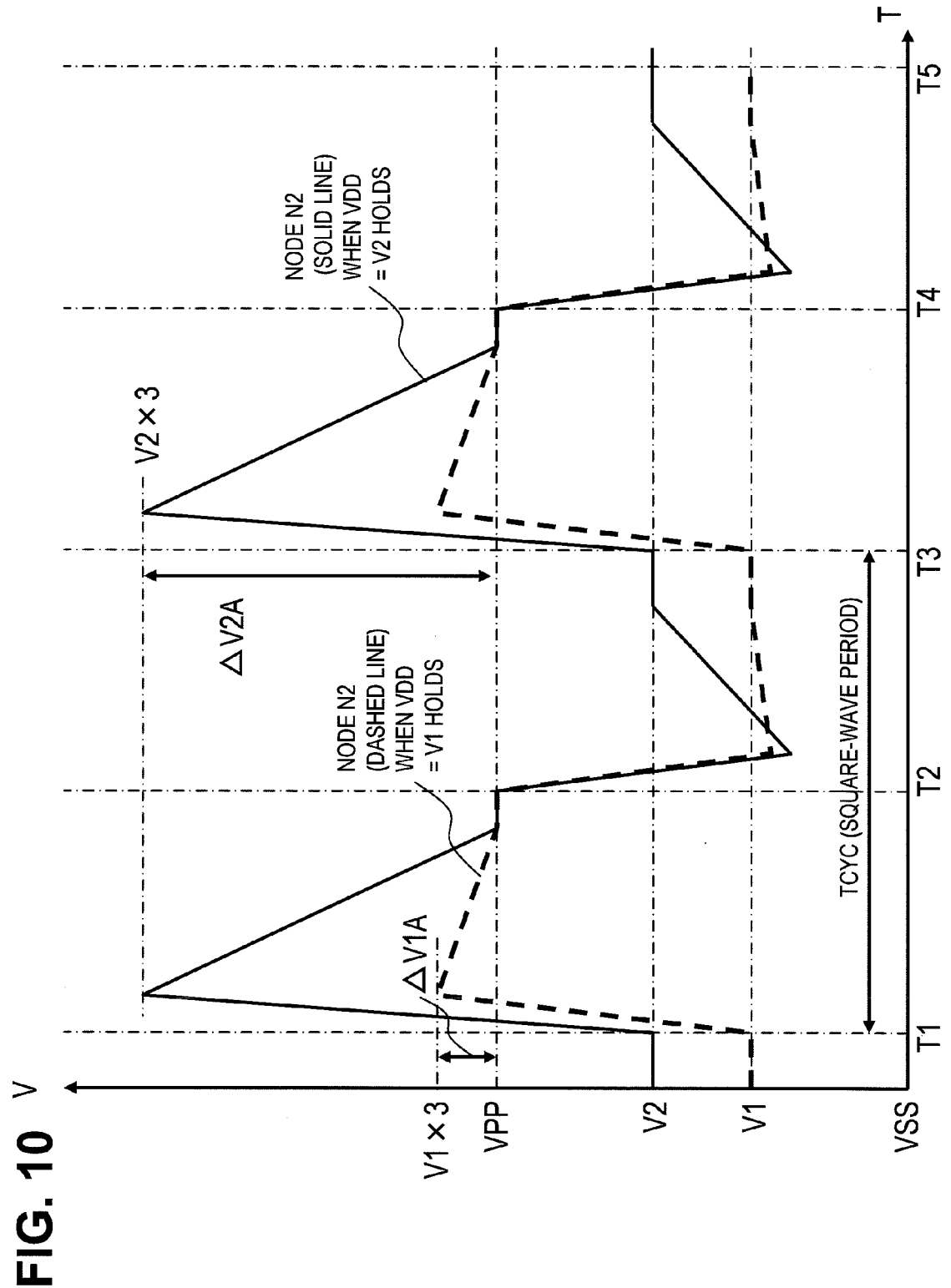
FIG. 10 is a waveform diagram of operation at a node on the output side of a boosting capacitor in a VPP generator according to a comparative example.

FIG. 10 is a waveform diagram of operation at the node N2 on the output side of the boosting capacitor in the VPP generator 103 according to the comparative example. The solid line in FIG. 10 indicates the waveform in a case where the voltage supplied from the VDD terminal, which is the external power supply terminal, is a maximum value V2, and the dashed line indicates the waveform in a case where the voltage supplied is a minimum value V1.

At timing T1 in FIG. 10, the logic level at clock terminal C2 (not shown in FIG. 10) falls from the high to the low level, whereupon the switching transistors 112, 114, 119 conduct and, hence, a voltage that is three times the voltage at the external power supply terminal VDD is produced at node N2. In a case where a load such as a smoothing capacitor has been connected to the VPP terminal, however, the electric charge at node N2 is discharged toward the VPP terminal via the switching transistor 119 and the potential at node N2 falls to a potential identical with that of VPP. When timing T2 arrives, the logic level at clock terminal C2 (not shown in FIG. 10) rises from the low to the high level, the switching transistors 114, 119 are rendered non-conductive and the switching transistors 115, 118 are rendered conductive. Owing to conduction of the switching transistor 115, the potential at node N3 falls from a potential greater than VDD to the ground level. The potential at node N2, therefore, also falls below VDD. However, since switching transistor 118 conducts, charging up to the VDD potential takes place. Operation from subsequent timings T3 to T5 is a repeat of the operation from timings T1 to T3.

When VDD=V1 holds, node N2 is at the V1 level just prior to the timings T1, T3. Immediately after the timings T1, T3, node N2 rises to a swing level that is twice V1 and attains a voltage that is about three times V1. In the time period from T1 to T2, VPP is supplied with electric charge from a voltage that is three times V1. Accordingly, current supply capability PS (V1) of the VPP generator 103 of FIG. 8 when VDD=V1 holds is represented by Equation (3) below, where TCYC represents the period of the clock signal supplied from the second control circuit 4, CP1 the capacitance value of the capacitor 16, and CP2 the capacitance value of the capacitor 17.

$$PS(V1)=[1/(1/CP1+1/CP2)]\times[V1\times3-VPP]/TCYC \quad \text{Equation (3)}$$

Similarly, the current supply capability when VDD=V2 holds is represented by Equation (4) below.

$$PS(V2)=[1/(1/CP1+1/CP2)]\times[V2\times3-VPP]/TCYC \quad \text{Equation (4)}$$

As will be understood from Equations (3) and (4), in the time periods T1 to T2 and T3 to T4 in FIG. 10 in which charge is discharged toward the VPP terminal, the effective boosting capacitance value of the VPP generator 103 of FIG. 8 is the serial capacitance value of the capacitors 116 and 117, namely 1/(1/CP1+1/CP2). If we assume that CP1=CP2 holds, then the effective boosting capacitance value is 0.5 times CP1.

On the other hand, the effective boosting capacitance of the VPP generator circuit of the first example is one times the capacitance value of the capacitor 16 in FIG. 4 since capacitors are not connected serially. Accordingly, the size of the capacitance (capacitor 14 in FIG. 4) in the first example can be made approximately one-fourth the size of the capacitance (the total capacitance of the capacitors 116 and 117 in FIG. 9) of the comparative example. As a consequence, the layout area of the VPP generator circuit of the first example can be reduced greatly as compared with the comparative example.

Further, as will be understood from Equations (3) and (4) or from FIG. 10, the ratio of the current supply capability of the VPP generator 103 when VDD=V1 holds to the current supply capability of the VPP generator 103 when VDD=V2 holds is proportional to the ratio of ΔV1A to ΔV2A. It should be noted that ΔV1A=V1×3−VPP, ΔΔ2A=V2×3−VPP holds.

More specifically, if the VPP generator, which generates a voltage higher than VPS, generates this voltage VPP from VDD (which has some latitude) supplied externally, as in the comparative example, then a large difference in current supply capability occurs between when VDD is on the low side and when it is on the high side in terms of operating specifications.

Figure 11:
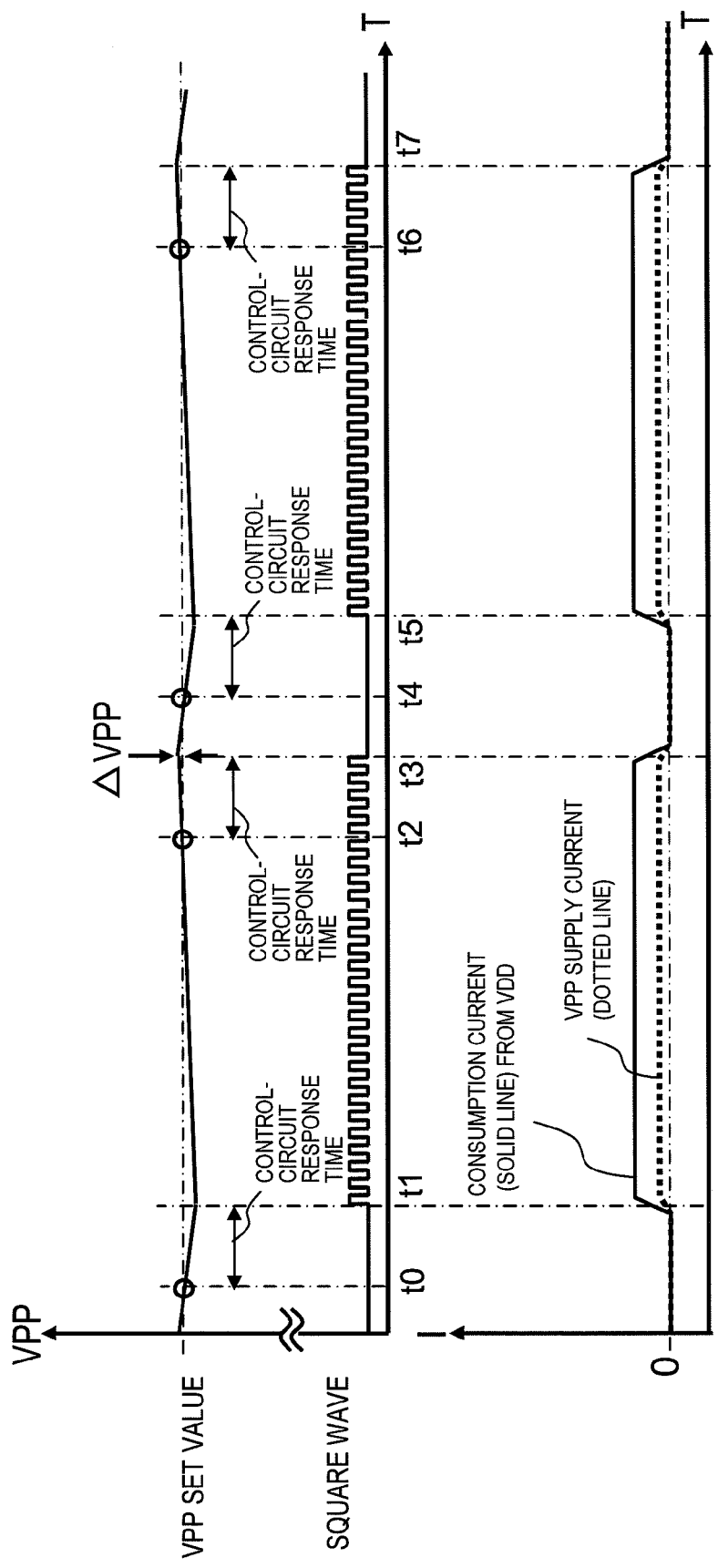
FIG. 11 is a first waveform diagram of voltage and current of a VPP power supply according to a comparative example (in a case where supply voltage supplied externally is low and current supply capability is small)
Figure 12:
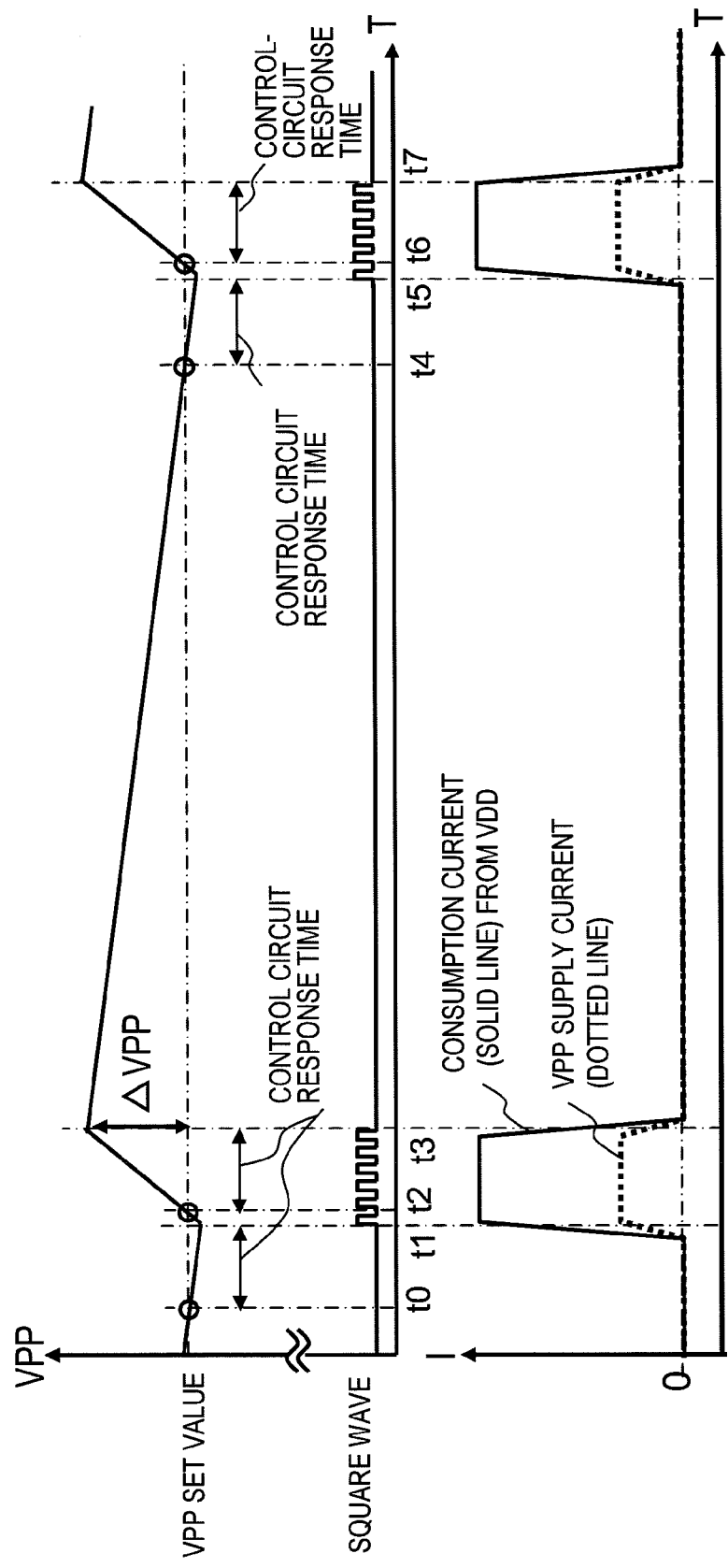
FIG. 12 is a second waveform diagram of voltage and current of a VPP power supply according to a comparative example (in a case where supply voltage supplied externally is high and current supply capability is large)

FIGS. 11 and 12 are waveform diagrams showing the voltage waveform of VPP and the current waveforms of VPP and VDD in a case where the current supply capability of the VPP generator 103 is small and in a case where the current supply capability is large, respectively. In FIG. 11 or 12, the second control circuit 4 halts the supply of the clock to the VPP generator 103 at a timing prior to timing t0. The VPP voltage, therefore, gradually declines. At timing t0, the VPP voltage falls below the threshold value of the voltage comparator circuit 21 of second control circuit 4. When this occurs, the voltage comparator circuit 21 detects the decline in VPP voltage, starts the oscillation of the oscillator circuit (ring oscillator) 22 and supplies the clock to the VPP generator 103. However, response time for the voltage comparator circuit 21, etc., is required from the moment the VPP voltage falls below a set value to the moment the clock (the square wave) is supplied to the VPP generator 103. The moment the VPP generator 103 starts the boosting operation is timing t1. When the VPP generator 103 starts boosting voltage, the VPP potential gradually rises and exceeds the VPP set value again at timing t2. When this occurs, the second control circuit 4 halts oscillation and the VPP generator 103 stops the boosting operation at timing t3 following elapse of the response time of the second control circuit 4. The VPP voltage gradually declines and, at timing t4, the VPP voltage falls below the set value of VPP. Operation from timing t4 onward is a repeat of the operation from timing t0 to timing t4. It should be noted that in time period t1 to t3 and in time period t5 to t7, the VPP generator 103 is supplied with the clock (square wave) from the second control circuit 4, and the VPP generator 103 performs the boosting operation. A constant consumption current therefore flows from VDD and VPP is supplied with a constant current. On the other hand, prior to timing t1, from timing t3 to t5 and from timing t7 onward, no clock is supplied from the second control circuit 4. In the VPP generator 103, therefore, no operating current flows from VDD and VPP is not supplied with current.

At timing t3 in FIGS. 11 and 12, the VPP voltage exceeds the set value of VPP owing to the charge pump operation, after which the second control circuit 4 responds halts the supply of the clock so that the VPP generator 103 halts the boosting operation. Equation (5) below holds, where ΔVPP represents the potential difference between the maximum voltage value of VPP when the VPP generator 103 halts the boosting operation and the VPP set voltage, and CVPP represents the capacitance value of the smoothing capacitor 7 connected to the VPP terminal.

$$\Delta VPP=\text{(current supply capability of } VPP \text{ generator)}\times \text{(control-circuit response time)}/CVPP \quad \text{Equation (5)}$$

It will be understood from Equation (5) and FIGS. 11, 12 that when the current supply capability of the VPP generator 103 is large, the VPP fluctuation level is large. This VPP fluctuation is referred to as ripple noise and has an adverse effect upon the circuit that uses the VPP voltage. For example, in a case where the VPP voltage is used as the power supply of the phase-change memory described in FIGS. 5 and 6, there is the danger that the reset program current IRESET will fluctuate and result in a problem such as the inability to program the memory cells correctly.

Furthermore, as can be understood if the waveforms of the consumption current from VDD in FIGS. 11 and 12 are compared, when the current capability of the VPP generator is larger than necessary, a large current is consumed from VDD in a short time (see FIG. 12). In this case, a great deal of VDD, VSS power supply noise is produced by the resistance and inductance, etc., of the VDD, VSS (ground) wiring. Such power supply noise is a problem as it has an adverse effect upon all of the circuitry within the chip and, in certain cases, upon the system in which the chip is used. Accordingly, a circuit scheme in which the current supply capability of the VPP generator circuit will not be allowed to become too large even if a high voltage is supplied to the external power supply terminal VDD is desired.

In the first example, the VPS generator 1 generates the supply voltage VPS, which is not dependent upon the external power supply voltage VDD. The VPP generator 3 generates the VPP voltage by using this stable VPS voltage. Accordingly, the VPP generator 3 of the first example is capable of generating a supply voltage that is more stable and less vulnerable to ripple noise than the supply voltage generated by the VPP generator 103 of the comparative example.

Figure 13:
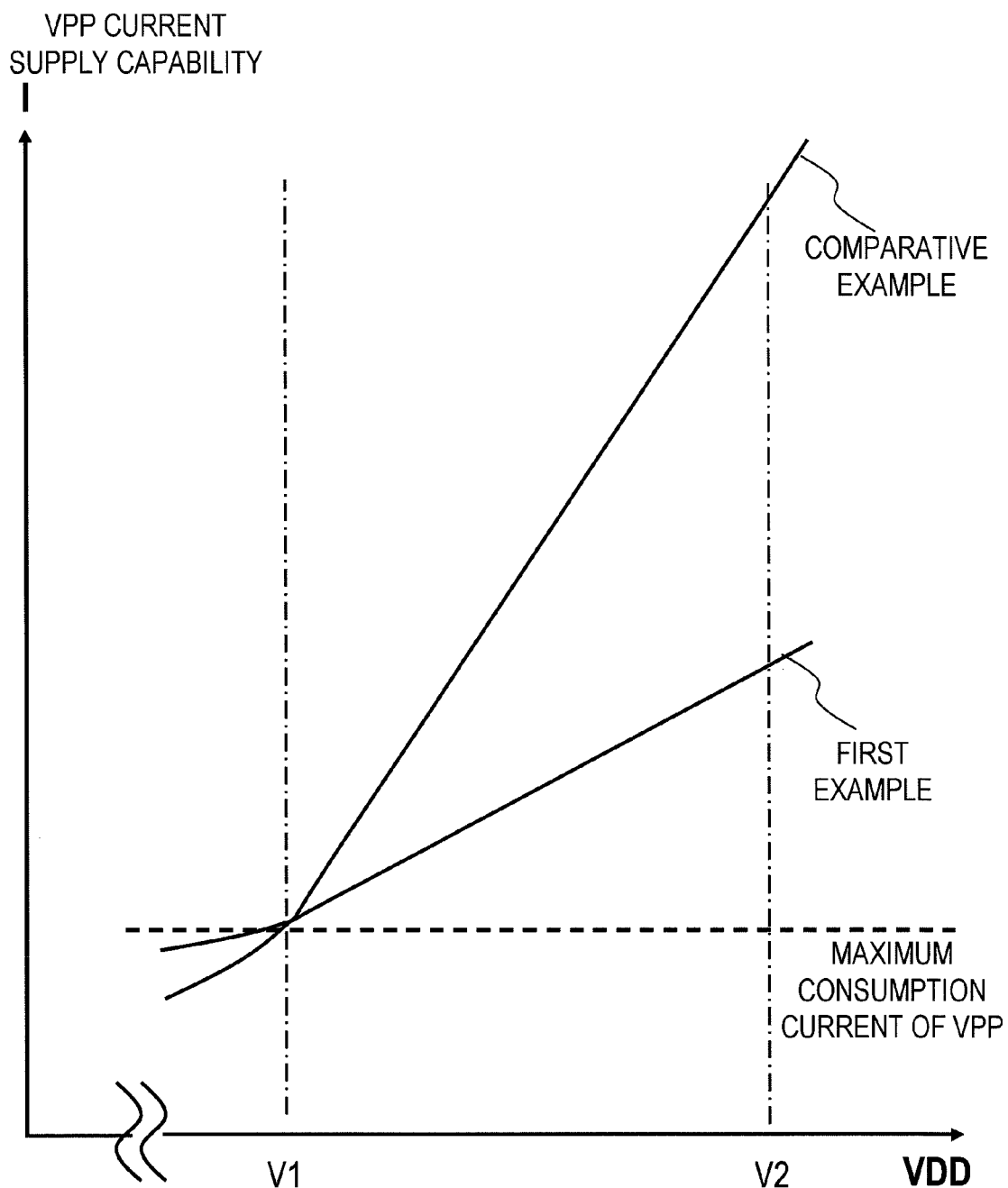
FIG. 13 is a graph illustrating the dependence of VPP current supply capability upon supply voltage in an example of the present invention and in a comparative example.

FIG. 13 is a graph illustrating the dependence of current supply capability of the VPP generator upon the external power supply voltage VDD when the VPP generator 3 of the first example and the VPP generator 103 of the comparative example are compared. The VPP generator is required to have a current supply capability for supplying a current greater than the maximum consumption current of VPP even in a case where the voltage value of the external power supply voltage VDD is the lower-limit value according to specification. Accordingly, both the VPP generator 3 of the first example and the VPP generator 103 of the comparative example are set so as to be capable of supplying current greater than the maximum consumption current when VDD is V1. Since the VPP generator 103 of the comparative example boosts only from VDD, its current supply capability depends greatly upon the voltage of VDD. On the other hand, the VPP generator 3 of the first example generates the supply voltage using the first supply voltage VPS and therefore its current supply capability is less dependent upon VDD than the VPP generator of the comparative example.

Second Example

Figure 14:
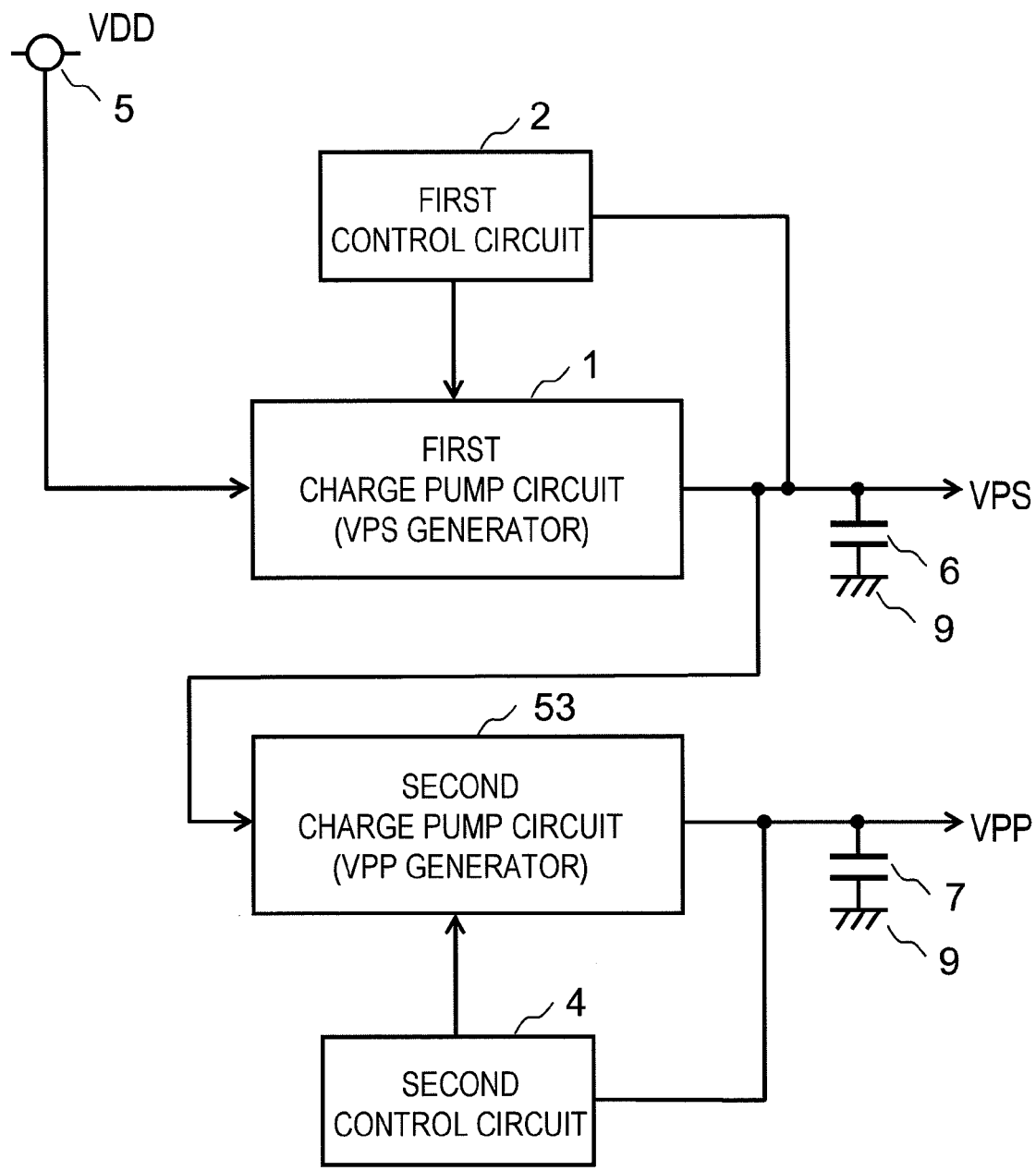
FIG. 14 is an overall block diagram of a supply voltage generating circuit according to another example of the present invention.

FIG. 14 is an overall block diagram of a supply voltage generating circuit according to a second example of the present invention. The second example differs from the first example in the structure of the second charge pump circuit (VPP generator). Specifically, VPP generator 53 in the second example is not supplied with power from the external power supply terminal VDD and is provided only with the VPS power supply produced by the first charge pump circuit (VPS generator) 1.

Figure 15:
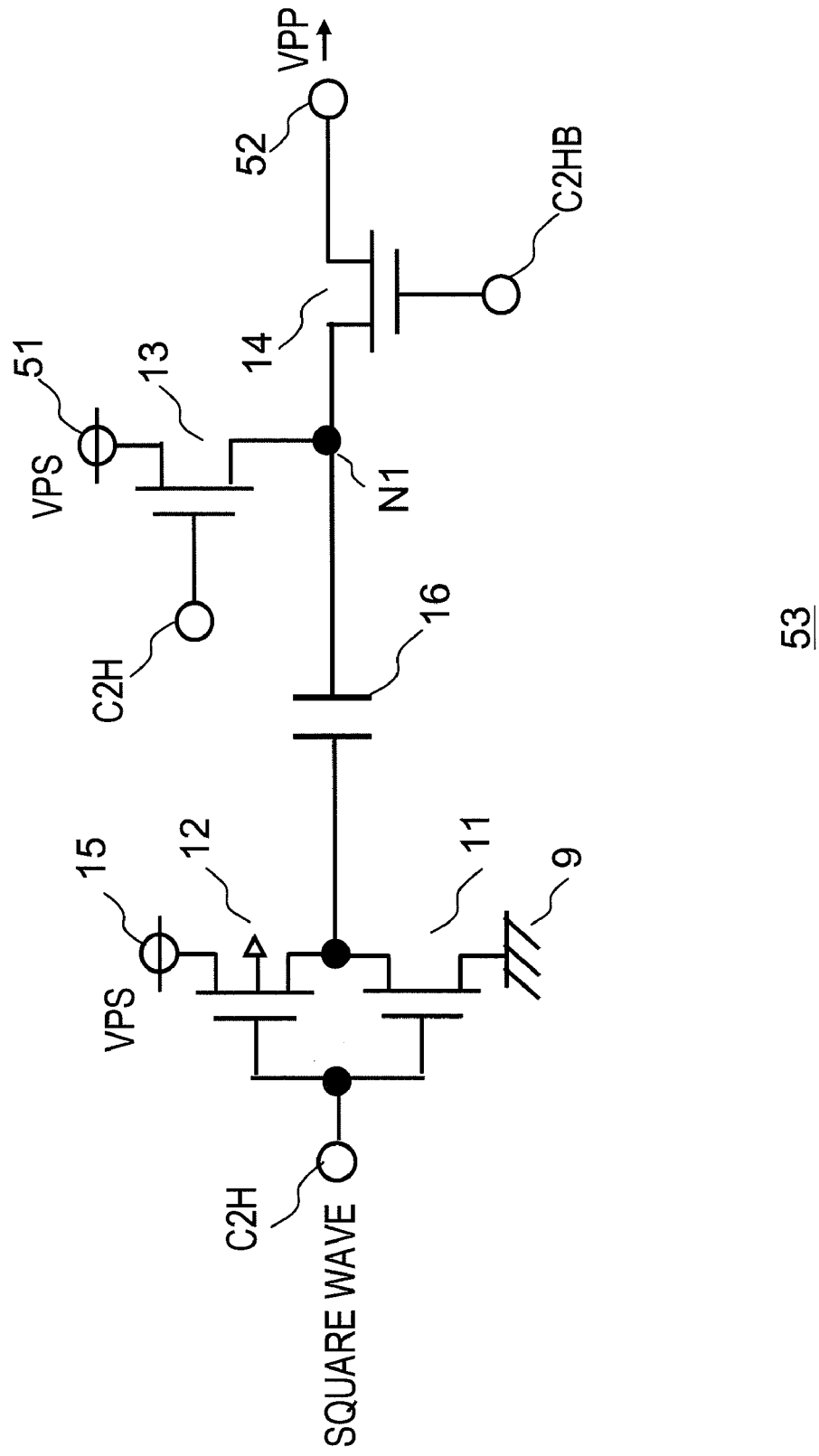
FIG. 15 is a block diagram illustrating a second charge pump circuit (VPP generator) in another example of the present invention.

FIG. 15 is a block diagram illustrating the second charge pump circuit (VPP generator) 53 of the second example. Whereas the source of the switching transistor 12 in the VPP generator 3 of the first example is connected to the VDD terminal, the source of the switching transistor 12 in the VPP generator 53 of the second example is connected to VPS. The structure of the VPP generator 53 of the second example is the same as that of the VPP generator 3 of the first example in other respects.

Assume that VPS=2×VDD, VPP=3×VDD holds. If one cycle of a square wave is input to the clock input terminal C2 of the VPP generator 53 in FIG. 15 of the second example, then current will flow from the voltage output terminal 52 to VPP. If we let I1 represent the value of the current supplied to VPP, then a current that has twice the value of I1 will be consumed from VPS. The reason for this is that in the charge pump operation, electric charge that is output from the capacitor 16 to VPP during the time that the clock input terminal C2 is at the low level flows from VPS through the switching transistor 12, and electrical charge in an amount identical with this electric charge re-charges the capacitor 16 from VPS through the switching transistor 13 during the time that the clock input terminal C2 is at the high level.

Accordingly, if the VPS current supply capability is set so as to exceed the value of Equation (2) and, moreover, the value of Equation (2) is greater than twice the value of Equation (1), then the VPS current supply capability will not be inadequate even though the current from VPS is consumed by the VPP generator 3.

If the value of Equation (2) is less than twice the value of Equation (1), then it will suffice if the current supply capability of VPS is set to be more than twice the value of Equation (1) rather than to exceed the value of Equation (2).

In the second example also there is only the single boosting capacitor 16 and boosting capacitors (116 and 117 in FIG. 9) are not serially connected as they are in the comparative example of FIG. 9. Accordingly, the size of the capacitance can be made approximately one-fourth in comparison with the size in the comparative example. As a consequence, the layout area of the VPP generator circuit of the second example can also be reduced greatly as compared with the comparative example. In particular, in the case of the phase-change memory described in conjunction with FIG. 5, it is necessary to supply the program current from VPS or to change over the program current from VPS for every program circuit 31 depending upon the "0", "1" data written to the memory cells. In a case where N bits are written simultaneously, the VPP load current will be large if the bits to which data "0" is written are many. However, at such time the bits to which "1" is written will be few and the VPS load current will be small. As a result, the VPS supply current can be sent for use in the VPP generator. In comparison with the comparative example, therefore, it is unnecessary to enlarge the boosting capacitor of the VPS generator and the overall layout area can be diminished to the extent that the area of the VPP generator can be reduced.

Figure 16:
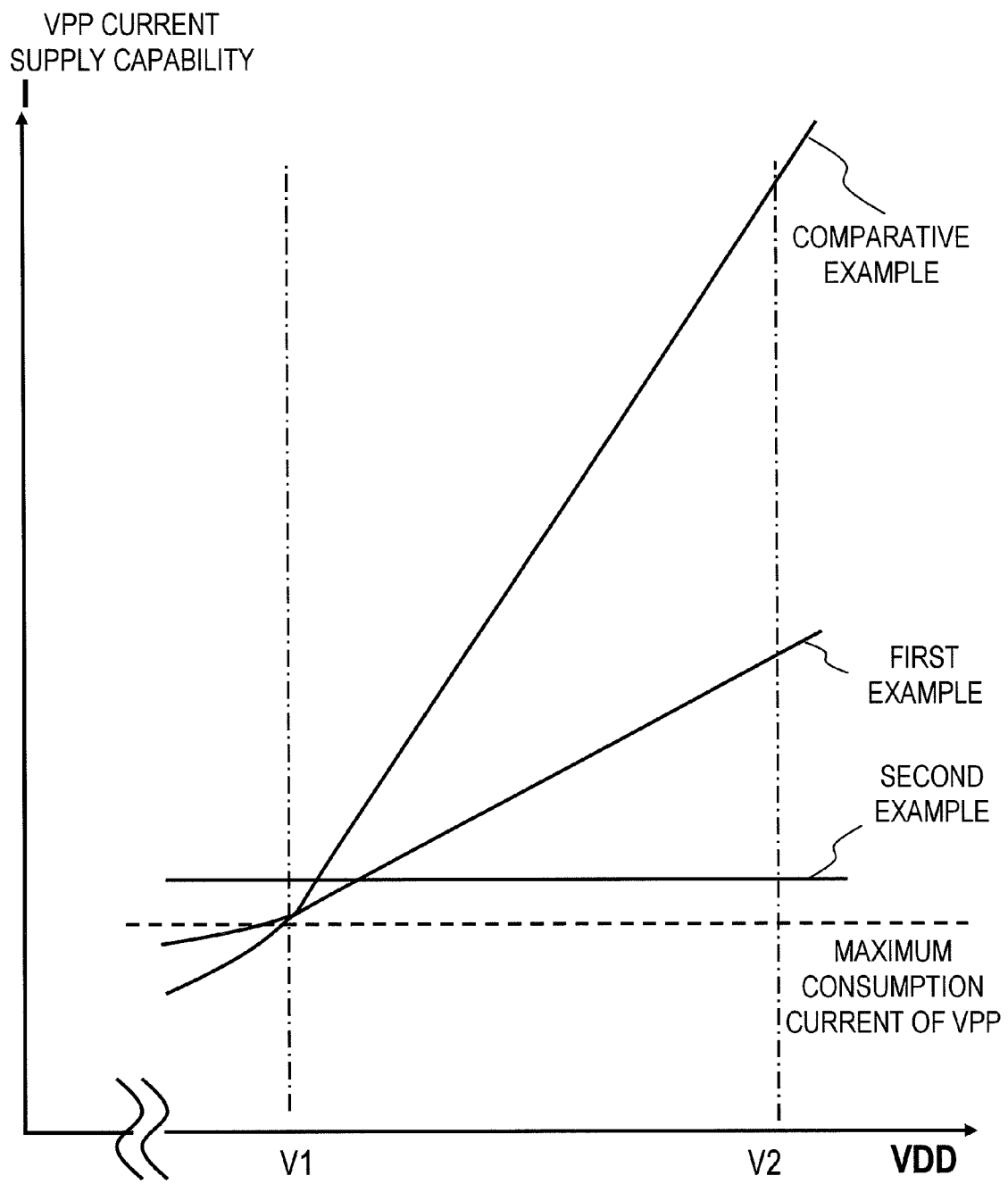
FIG. 16 is a graph illustrating the dependence of VPP current supply capability upon supply voltage in another example of the present invention.

FIG. 16 is a graph illustrating the dependence of current supply capability of the VPP generator 53 upon the external power supply voltage VDD. In the second example, the power supply of the charge pump circuit 53 does not rely upon VDD and therefore the VPP current supply capability does not depend upon VDD. Accordingly, the charge pump circuit 53 is less vulnerable to ripple noise ascribable to excessive current supply capability in the VPP generator, which is a problem in the comparative example. Further, the VPP supply voltage obtained is more stable and less susceptible to ripple noise even in comparison with the first example.

It should be noted that the invention is not limited to the relationships set forth above in the description of the second technical idea of the preferred modes, namely the size relationship between a first load current (i1') and a second load current (i2'), the size relationship between a first consumption load value p1', which indicates total charge amount (q1') consumed by a load circuit that is in a first state, and a second consumption load value p2', which indicates total charge amount (q2') consumed by a load circuit that is in a second state, and the size relationship between a first charge pump capability (first capability) and a second charge pump capability (second capability). For example, the relationships i1'>i2' and p1'>p2' are permissible, and the relationship P2>P1 is permissible.

In the description of the preferred modes, the focus is upon the examples in which a supply voltage generating circuit is mainly used in generating the power sources of set and reset program pulses of a phase-change memory. However, the supply voltage generating circuit of the present invention can be used in other applications as well. In particular, the supply voltage generating circuit can be used as a circuit for generating a supply voltage outside the range of an externally applied supply voltage.

For instance, although a storage element which is a phase-change element is disclosed in the examples, the basic technical idea of this application is not limited to this idea and the storage element can just as well be one in which prescribed information is written by current. Another example is a resistance-change memory such as an Re-RAM. Furthermore, the corresponding relationship between set and reset and information 1 and 0, and the corresponding relationship between these and the first and second states may each be reversed. In addition, it goes without saying that the specific form of the charge pumps includes a variety of circuit schemes and various charge pump circuits can be implemented within the scope of the claims of the application. The specific form of the circuitry of the control circuits that control the charge pumps does not matter.

The semiconductor device disclosed in the claims is not limited to a semiconductor device having a discrete memory storage function in the form of a so-called passive component. For example, products included are those in which the present application is applied to a storage function unit incorporated in a semiconductor device serving as an active component. For example, it goes without saying that the invention is applicable to all semiconductor device such as a CPU, MPU, DSP and logic. Furthermore, the invention is applicable to such semiconductor devices as an SOC (System-On-Chip), MCP (Multi-Chip Package) and POP (Package-On-Package). Furthermore, a memory system equipped with the claims of the application is useful, and it goes without saying that the invention is not limited to a memory system and is useful in all systems equipped with semiconductor devices.

Further, the transistors may be field-effect transistors (FETs) and the invention is also applicable to MOS (Metal Oxide Semiconductor) and MIS (Metal-Insulator Semiconductor) and to various FETs such as TFTs (Thin-Film Transistors). Some of these may include bipolar transistors.

Furthermore, an NMOS transistor (N-channel MOS transistor) is a typical example of a first-conductivity-type transistor, and a PMOS transistor (P-channel MOS transistor) is a typical example of a second-conductivity-type transistor.

Further, the present application is not limited to a non-volatile storage device in which the resistance value differs depending upon stored information and is useful also in a non-volatile storage device in which the ON resistance (resistance at the time of conduction) of a transistor that stores information is changed by the current that flows into the storage section (the amount of current per prescribed time or the time during which the current is passed, namely the total amount of current).

Further, although this application discloses a positive power supply generating circuit constituted by charge pumps that generate positive voltage, the invention is also applicable to a negative supply voltage generating circuit constituted by charge pumps that generate negative voltage. In this case, the storage section that stores information stores each information value by current that flows between a negative voltage source and ground. With regard to transistors within the charge pump circuit or transistors peripheral to the storage section, it will suffice if the conductivity type is changed from the first conductivity type to the second conductivity type, or vice versa, as necessary. Those skilled in the art can implement the claims of the application with ease.

Though the present invention has been described in accordance with the foregoing examples, the invention is not limited to these examples and it goes without saying that the invention covers various modifications and changes that would be obvious to those skilled in the art within the scope of the claims.

What is claimed is:

1. A supply voltage generating circuit comprising:
   a first charge pump circuit that generates a first internal supply voltage; and
   a second charge pump circuit that generates a second internal supply voltage having a voltage value larger than that of the first internal supply voltage in terms of absolute value;
   wherein a secondary-side output terminal of said first charge pump circuit is connected to a charging terminal of said second charge pump circuit, said secondary-side being an output-side of the corresponding charge pump circuit, said charging terminal being an auxiliary charging terminal that supplies an auxiliary charge to a secondary-side output terminal of the corresponding charge pump circuit, and the secondary-side output terminal of said second charge pump circuit outputs a voltage value that is the result of adding a prescribed voltage value to the value of the first internal supply voltage applied to the charging terminal.

2. The circuit according to claim 1, wherein each of said first and second charge pump circuits comprises:
   a boosting capacitance element;
   a first switch circuit, which is an input side of said charge pump circuit, connected to a first end of said capacitance element, which is a primary side; and
   a second switch circuit, which is an output side of said charge pump circuit, connected to a second end of said capacitance element, which is a secondary side; and
   said first switch circuit switches between first and second terminals alternatingly in conformity with a control signal and impresses a voltage applied to the first terminal and a voltage applied to the second terminal upon the first end of said capacitance element alternatingly;
   said second switch circuit switches between a third terminal and the output terminal, which is the secondary side of said charge pump circuit, alternatingly in operative association with a switching operation of said first switch circuit, and outputs to the output terminal a voltage value obtained by adding a voltage, which is related to amount of transition of voltage at the first end of said capacitance element, to a voltage applied to the third terminal; wherein
   the third terminal of said second charge pump circuit is connected to the charging terminal and the first internal supply voltage is supplied to the third terminal of said second charge pump circuit.

3. The circuit according to claim 2, wherein the first internal supply voltage is supplied to the first terminal of said second charge pump circuit.

4. The circuit according to claim 2, wherein said supply voltage generating circuit is supplied with an externally supplied external supply voltage, whose voltage value fluctuates a prescribed amount and which is smaller than the first internal supply voltage in terms of absolute value, and a low supply voltage smaller than the external supply voltage in terms of absolute value; and
   the first and third terminals of said first charge pump circuit and the first terminal of said second charge pump circuit are each supplied with the external supply voltage, and the second terminal of each of said first and second charge pump circuits is supplied with the low supply voltage.

5. The circuit according to claim 2, wherein said supply voltage generating circuit is supplied with a third supply voltage smaller than the first internal supply voltage in terms of absolute value and with a fourth supply voltage smaller than the third supply voltage in terms of absolute value;
   the first and third terminals of said first charge pump circuit are each supplied with the third supply voltage; and
   the second terminal of each of said first and second charge pump circuits is supplied with the fourth supply voltage.

6. The circuit according to claim 1, wherein N-number, where N is an integer and N≧2 holds, of load circuits are connected to said supply voltage generating circuit;
   each of said load circuits has any one state among first and second states, which indicate an operating state, and third state indicating a non-operating state;
   said first charge pump circuit supplies the first internal supply voltage from the output terminal of said first charge pump to each load circuit that is in the first state;

said second charge pump supplies the second internal supply voltage from the output terminal of said second charge pump to each load circuit that is in the second state; and when the total number of load circuits in the second state among said N-number of load circuits is Y (where Y is an integer and Y≧1 holds), said first charge pump supplies said second charge pump, via the charging terminal, with at least an amount of charge q2'×Y, which corresponds to the number Y of load circuits, necessary for the second state.

7. The circuit according to claim 1, wherein N-number (where N is an integer and N≧2 holds) of load circuits are connected to said supply voltage generating circuit;

each of said load circuits has any one state among first and second states, which indicate an operating state, and third state indicating a non-operating state;

said first charge pump circuit supplies the first internal supply voltage from the output terminal of said first charge pump to each load circuit that is in the first state;

said second charge pump supplies the second internal supply voltage from the output terminal of said second charge pump to each load circuit that is in the second state; and when the total number of load circuits in the second state and third state among said N-number of load circuits is Y+Z [where (Y+Z) is an integer and (Y+Z)≧1 holds], said first charge pump supplies said second charge pump, via the charging terminal, with an amount of charge q1'×(Y+Z), which corresponds to the number (Y+Z) of load circuits, necessary for the first state.

8. The circuit according to claim 1, wherein N-number, where N is an integer and N≧2 holds, of load circuits are connected to said supply voltage generating circuit;

each of said load circuits has any one state among first and second states, which indicate an operating state, and third state indicating a non-operating state;

a first consumption load p1' in the first state is larger than a second consumption load p2' in the second state, and a maximum consumption load P of said supply voltage generating circuit is N×p1';

said first charge pump circuit has a first capability for supplying consumption current corresponding to N-number of load circuits in the first state, and supplies a load circuit in the first state with the first internal supply voltage from the output terminal of said first charge pump circuit;

said second charge pump has a second capability for supplying consumption current corresponding to N-number of load circuits in the second state, and supplies a load circuit in the second state with the second internal supply voltage from the output terminal of said second charge pump circuit; and said first charge pump circuit supplies said second charge pump circuit, via the charging terminal, with a consumption current equivalent to the difference between the first consumption current p1' and the second consumption current p2'.

* * * * *